United States Patent
Nakano et al.

(10) Patent No.: US 10,283,645 B2
(45) Date of Patent: May 7, 2019

(54) SEMICONDUCTOR DEVICE AND METHOD FOR MANUFACTURING SAME

(71) Applicant: Sharp Kabushiki Kaisha, Sakai, Osaka (JP)

(72) Inventors: Fumiki Nakano, Sakai (JP); Sumio Katoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/747,774

(22) PCT Filed: Jul. 26, 2016

(86) PCT No.: PCT/JP2016/071888
§ 371 (c)(1),
(2) Date: Jan. 26, 2018

(87) PCT Pub. No.: WO2017/018416
PCT Pub. Date: Feb. 2, 2017

(65) Prior Publication Data
US 2018/0226512 A1  Aug. 9, 2018

(30) Foreign Application Priority Data
Jul. 27, 2015  (JP) ................................ 2015-147710

(51) Int. Cl.
*H01L 29/786* (2006.01)
*G02F 1/1368* (2006.01)
(Continued)

(52) U.S. Cl.
CPC ...... *H01L 29/78696* (2013.01); *G02F 1/1368* (2013.01); *G02F 1/136213* (2013.01);
(Continued)

(58) Field of Classification Search
CPC ..................... H01L 29/78696; G02F 1/136213
(Continued)

(56) References Cited

U.S. PATENT DOCUMENTS

2012/0097955 A1* 4/2012 Wu .................... H01L 29/41733
257/59
2012/0138922 A1  6/2012 Yamazaki et al.
(Continued)

FOREIGN PATENT DOCUMENTS

JP  2012-134475 A  7/2012
JP  5330603 B2  10/2013
(Continued)

*Primary Examiner* — Igwe U Anya
(74) *Attorney, Agent, or Firm* — Keating & Bennett, LLP

(57) ABSTRACT

A semiconductor device includes a TFT (101), the TFT including a gate electrode (12), a gate insulating layer (14) covering the gate electrode, a metal oxide layer (16A) including a channel region (16c), a source contact region (16s) and a drain contact region (16d), a first electrode (18A) in contact with the source contact region, an insulating layer (22) formed on the metal oxide layer and the first electrode, the insulating layer having a first opening (22p) therein through which a portion of the metal oxide layer is exposed, and a light-transmissive second electrode (24) formed on the insulating layer and in a contact hole including the first opening, wherein the second electrode (24) is in contact with the drain contact region (16d) in the contact hole, the drain contact region (16d) is a portion of a region (17) of the metal oxide layer (16A) that is exposed through the contact hole, and as seen from a direction normal to a substrate (11), the second electrode (24) does not overlap the channel region (16c).

20 Claims, 18 Drawing Sheets

(51) Int. Cl.
*G02F 1/1362* (2006.01)
*H01L 27/12* (2006.01)
*H01L 29/423* (2006.01)
*H01L 29/417* (2006.01)

(52) U.S. Cl.
CPC ........ *H01L 27/124* (2013.01); *H01L 27/1225* (2013.01); *H01L 27/1251* (2013.01); *H01L 29/41733* (2013.01); *H01L 29/42384* (2013.01); *H01L 29/7869* (2013.01); *G02F 2201/121* (2013.01); *G02F 2201/123* (2013.01)

(58) Field of Classification Search
USPC ........................................... 257/347
See application file for complete search history.

(56) References Cited

U.S. PATENT DOCUMENTS

| | | |
|---|---|---|
| 2013/0201420 A1 | 8/2013 | Misaki |
| 2013/0320334 A1 | 12/2013 | Yamazaki et al. |
| 2014/0139774 A1* | 5/2014 | Tsai .................. H01L 27/3258 349/43 |
| 2014/0286076 A1 | 9/2014 | Aoki et al. |

FOREIGN PATENT DOCUMENTS

| | | |
|---|---|---|
| JP | 2014-007399 A | 1/2014 |
| JP | 2014-209727 A | 11/2014 |

* cited by examiner (a)

(b)

(a)

(b)

(a)

(b)

US 10,283,645 B2

SEMICONDUCTOR DEVICE AND METHOD FOR MANUFACTURING SAME

TECHNICAL FIELD

The present invention relates to a semiconductor device including a thin film transistor, and a method for manufacturing the same.

BACKGROUND ART

Display devices having active matrix substrates that are provided with a switching element for each pixel have been widely used. Active matrix substrates having thin film transistors (hereinafter "TFTs") as switching elements are called TFT substrates. Note that in the present specification, a portion of a TFT substrate that corresponds to a pixel of the display device may also be called a pixel.

In recent years, it has been proposed to use an oxide semiconductor, instead of amorphous silicon or polycrystalline silicon, as the material of an active layer of a TFT. Such a TFT is called an "oxide semiconductor TFT". An oxide semiconductor has a higher mobility than amorphous silicon. Therefore, an oxide semiconductor TFT is capable of operating at a higher speed than an amorphous silicon TFT. Moreover, since an oxide semiconductor film is formed by a process that is simpler than a polycrystalline silicon film, it can be applied to apparatuses that require a large area.

A TFT substrate using an oxide semiconductor TFT typically includes an oxide semiconductor TFT (hereinafter abbreviated simply as "TFT"), an interlayer insulating film covering the TFT, and a pixel electrode electrically connected to the drain electrode of the TFT. The source and drain electrodes of the TFT are formed from a metal film, for example. The pixel electrode is normally provided on the interlayer insulating film, and is connected to the drain electrode of the TFT in a contact hole formed in the interlayer insulating film.

On the other hand, a configuration in which the pixel electrode is arranged so as to be in direct contact with an oxide semiconductor layer of the TFT is proposed in Patent Document No. 1. FIG. 23 is a cross-sectional view illustrating a TFT substrate 2000 disclosed in Patent Document No. 1. The TFT substrate 2000 includes a substrate 921, a TFT supported on the substrate 921, an interlayer insulating film (flattening layer) 926 covering the TFT, and a pixel electrode 928. The TFT includes a gate electrode 922, a gate insulating layer 923, an oxide semiconductor layer 924 and a source electrode 925s. The source electrode 925s is formed from a metal film having a layered structure, and is arranged so as to be in contact with the upper surface of the oxide semiconductor layer 924. The pixel electrode 928 is provided on the interlayer insulating film 926 and in a contact hole 927 formed in the interlayer insulating film 926, and is in direct contact with the oxide semiconductor layer 924 in the contact hole 927. That is, a portion of the pixel electrode 928 functions as a drain electrode.

In the present specification, a portion of the oxide semiconductor layer 924 that is in contact with the pixel electrode 928 is called a drain contact region 924ad, a portion thereof that is in contact with the source electrode 925s is called a source contact region, and a portion thereof that is located between the source contact region and the drain contact region 924ad is called a channel region 924ac. A connecting portion that directly connects between the pixel electrode 928 and the oxide semiconductor layer 924 is called a "pixel contact portion", and the contact hole 927 that is formed in the interlayer insulating film 926 and connects between the pixel electrode 928 and the oxide semiconductor layer 924 is called a "pixel contact hole".

CITATION LIST

Patent Literature

[Patent Document No. 1] Japanese Patent No. 5330603

SUMMARY OF INVENTION

Technical Problem

As a result of a study by the present inventor, it was found that with a configuration proposed in Patent Document No. 1, the voltage applied to the pixel electrode 928 influences the channel region 924ac, and the threshold voltage Vth of the TFT may vary depending on the voltage of the pixel electrode 928.

An embodiment of the present invention has been made in view of the above, and it is an object thereof to provide a semiconductor device having an oxide semiconductor TFT whose TFT characteristics are more stable.

Solution to Problem

A semiconductor device according to an embodiment of the present invention is a semiconductor device including a substrate and a thin film transistor supported on the substrate, wherein: the thin film transistor includes: a gate electrode; a gate insulating layer covering the gate electrode; a metal oxide layer arranged on the gate insulating layer, the metal oxide layer including a channel region, and a source contact region and a drain contact region that are arranged on opposite sides of the channel region; a first electrode arranged so as to be in contact with the source contact region of the metal oxide layer; an insulating layer formed on the metal oxide layer and the first electrode, the insulating layer having a first opening therein through which a portion of the metal oxide layer is exposed; and a light-transmissive second electrode formed on the insulating layer and in a contact hole including the first opening; wherein the second electrode is in contact with the drain contact region in the contact hole, and the drain contact region is a portion of a region of the metal oxide layer that is exposed through the contact hole; and as seen from a direction normal to the substrate, the second electrode does not overlap the channel region of the metal oxide layer.

In one embodiment, as seen from the direction normal to the substrate, a channel region-side edge portion of the second electrode extends across the region of the metal oxide layer that is exposed through the contact hole.

In one embodiment, the semiconductor device further includes: another insulating layer formed on the insulating layer and the second electrode, and a light-transmissive third electrode formed on the other insulating layer, wherein: of the region of the metal oxide layer that is exposed through the contact hole, a portion that is not in contact with the second electrode is in contact with the other insulating layer.

In one embodiment, the other insulating layer has a capability of reducing the metal oxide layer, and a portion of the metal oxide layer that is in contact with the other insulating layer is a low resistance region having a lower electric resistance than the channel region.

In one embodiment, the semiconductor device further includes: between the insulating layer and the second electrode, a light-transmissive third electrode formed on the insulating layer, and another insulating layer covering the third electrode, wherein: the other insulating layer has a second opening, and at least a portion of the second opening overlaps the first opening as seen from the direction normal to the substrate; the contact hole includes the first opening and the second opening; and the second electrode is formed on the other insulating layer and in the contact hole.

In one embodiment, at a side wall of the contact hole, a side surface of the second opening and a side surface of the first opening are aligned together.

In one embodiment, the second electrode is a pixel electrode.

In one embodiment, a portion of the third electrode is exposed through the second opening; and the second electrode is in contact with the drain contact region of the metal oxide layer and a portion of the third electrode in the contact hole, whereby the third electrode is connected to the drain contact region with the second electrode therebetween.

In one embodiment, the third electrode is a pixel electrode.

The thin film transistor may have a channel-etch structure.

The semiconductor device may further include a protective layer arranged between the metal oxide layer and the first electrode, the protective layer covering at least the channel region.

The metal oxide layer may include tin, and the second electrode may not include tin.

The metal oxide layer may include an In—Sn—Zn—O-based oxide.

The second electrode may include an indium-zinc oxide.

The insulating layer may not include an organic insulating layer.

A method for manufacturing a semiconductor device according to an embodiment of the present invention includes the steps of: (A) forming a gate electrode and a gate line on a substrate; (B) forming a gate insulating layer covering the gate electrode and the gate line; (C) forming an oxide semiconductor film on the gate insulating layer and patterning the oxide semiconductor film, thereby obtaining a metal oxide layer; (D) forming a first electrode in contact with a portion of an upper surface of the metal oxide layer; (E) forming an insulating layer covering the metal oxide layer and the first electrode; (F) forming a contact hole in the insulating layer, through which a portion of an upper surface of the metal oxide layer is exposed; (G) forming a light-transmissive second electrode on the insulating layer and in the contact hole, wherein the second electrode is in contact, in the contact hole, with a portion of a region of the metal oxide layer that is exposed through the contact hole; (H) forming another insulating layer that covers the insulating layer and the second electrode and is in contact, in the contact hole, with another portion of the region of the metal oxide layer that is exposed through the contact hole; and (I) forming a third electrode on the other insulating layer.

A method for manufacturing a semiconductor device according to another embodiment of the present invention includes the steps of: (A) forming a gate electrode and a gate line on a substrate; (B) forming a gate insulating layer covering the gate electrode and the gate line; (C1) forming an oxide semiconductor film on the gate insulating layer and patterning the oxide semiconductor film, thereby obtaining a metal oxide layer; (C2) forming an etch stop layer covering the metal oxide layer, and forming an opening in the etch stop layer, through which a portion of the metal oxide layer is exposed; (D) forming a first electrode on the etch stop layer and in the opening, the first electrode being in contact with the metal oxide layer in the opening; (E) forming an insulating layer covering the etch stop layer and the first electrode; (F) forming a contact hole in the insulating layer and the etch stop layer, through which a portion of an upper surface of the metal oxide layer is exposed; (G) forming a light-transmissive second electrode on the insulating layer and in the contact hole, wherein the second electrode is in contact, in the contact hole, with a portion of a region of the metal oxide layer that is exposed through the contact hole; (H) forming another insulating layer that covers the insulating layer and the second electrode and is in contact, in the contact hole, with another portion of the region of the metal oxide layer that is exposed through the contact hole; and (I) forming a third electrode on the other insulating layer.

In one embodiment, the second electrode does not include tin, and the metal oxide layer includes tin; and the step (G) includes a step of etching the second electrode without removing the metal oxide layer by using a phosphate-based etching solution.

In one embodiment, the other insulating layer has a capability of reducing the metal oxide layer, and a portion of the metal oxide layer that is in contact with the other insulating layer is a low resistance region having a lower electric resistance than a portion of the metal oxide layer that is in contact with the insulating layer.

A method for manufacturing a semiconductor device according to still another embodiment of the present invention includes the steps of: (a) forming a gate electrode and a gate line on a substrate; (b) forming a gate insulating layer covering the gate electrode and the gate line; (c) forming an oxide semiconductor film on the gate insulating layer and patterning the oxide semiconductor film, thereby obtaining a metal oxide layer; (d) forming a first electrode in contact with a portion of an upper surface of the metal oxide layer; (e) forming an insulating layer covering the metal oxide layer and the first electrode; (f) forming another light-transmissive electrode on the insulating layer; (g) forming another insulating layer so as to cover the insulating layer and the other electrode; (h) etching the insulating layer and the other insulating layer, thereby forming a contact hole through which a portion of an upper surface of the metal oxide layer is exposed; and (i) forming a light-transmissive second electrode on the insulating layer and in the contact hole, wherein the second electrode is in contact, in the contact hole, with a portion of a region of the metal oxide layer that is exposed through the contact hole.

In one embodiment, in the step (h), the contact hole exposes a portion of an upper surface of the metal oxide layer and a portion of the other electrode; and in the step (i), the second electrode is in contact, in the contact hole, with a portion of a region of the metal oxide layer that is exposed through the contact hole and the other electrode.

In one embodiment, the second electrode does not include tin, and the metal oxide layer includes tin; and the step (i) includes a step of etching the second electrode without removing the metal oxide layer by using a phosphate-based etching solution.

The second electrode may include an indium-zinc oxide.

Advantageous Effects of Invention

According to an embodiment of the present invention, it is possible to provide a semiconductor device having an oxide semiconductor TFT whose TFT characteristics are more stable.

DESCRIPTION OF EMBODIMENTS

As described above with reference to FIG. 23, with the structure of Patent Document No. 1, the threshold voltage Vth of the TFT may possibly vary depending on the voltage of the pixel electrode 928. As a result of a study by the present inventor, it is believed that this is because the pixel electrode 928 is arranged so as to cover the entire pixel contact hole, and therefore a portion of the pixel electrode 928 overlaps the channel region 924ac of the oxide semiconductor layer 924 with the interlayer insulating film 926 therebetween, as shown by a broken line 930 in FIG. 23.

In contrast, the present inventor has found a novel structure in which the pixel electrode is arranged so as to be in contact only with a portion of the oxide semiconductor layer exposed through the pixel contact hole. Thus, it is possible to arrange the pixel electrode (drain electrode) so as not to overlap the channel region, and it is possible to suppress the variation of the threshold voltage Vth due to the voltage of the pixel electrode.

First Embodiment

A semiconductor device according to a first embodiment will now be described with reference to the drawings. While a TFT substrate used in a liquid crystal display device will be illustrated below as the semiconductor device, the semiconductor device according to an embodiment of the present invention includes TFT substrates of other transmissive display devices, e.g., electrophoretic display devices, MEMS (Micro Electro Mechanical System) display devices, and organic EL (Electroluminescence) display devices.

Figure 1A:
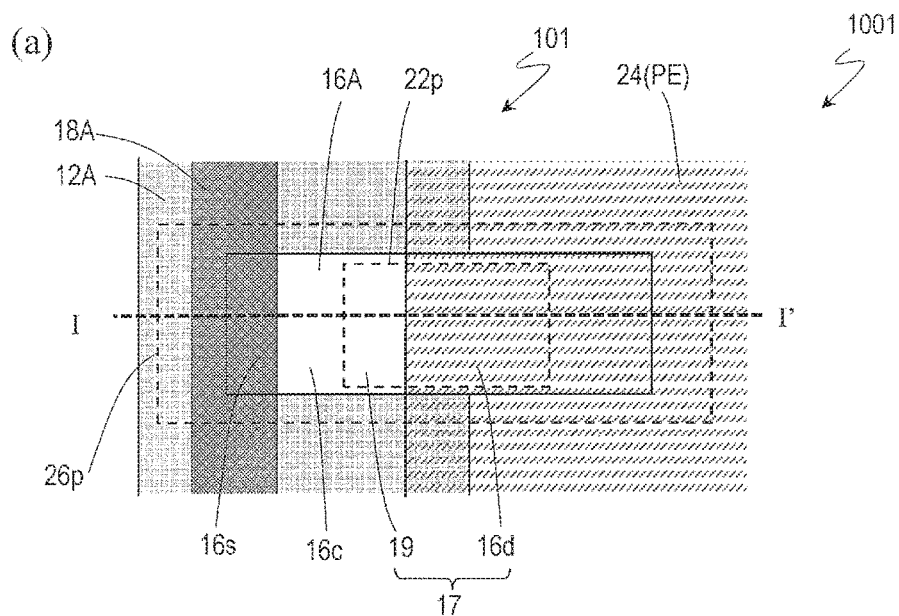
FIGS. 1A(a) and 1A(b) are a plan view and a cross-sectional view, respectively, schematically showing a portion of a semiconductor device (TFT substrate) 1001 of a first embodiment.
Figure 1A:
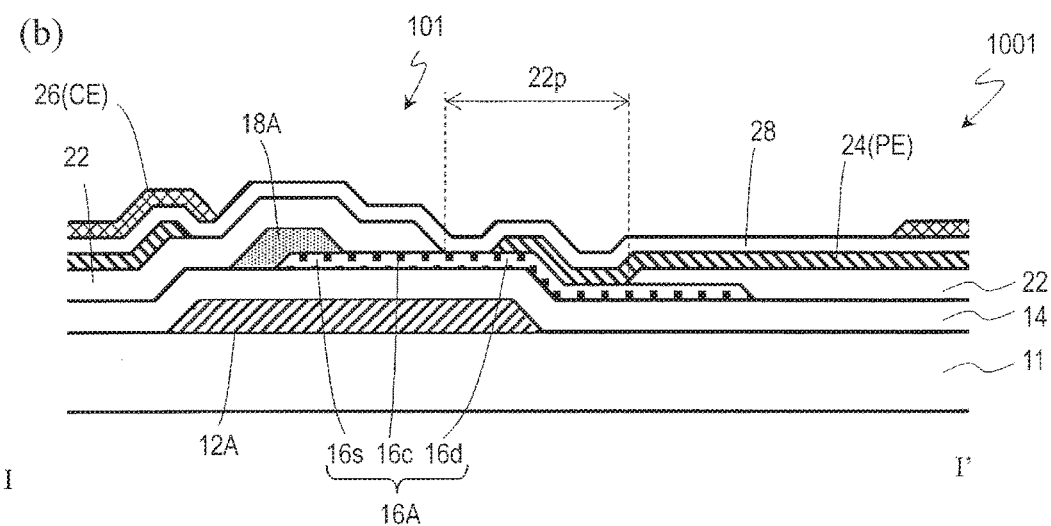
Figure 1B:
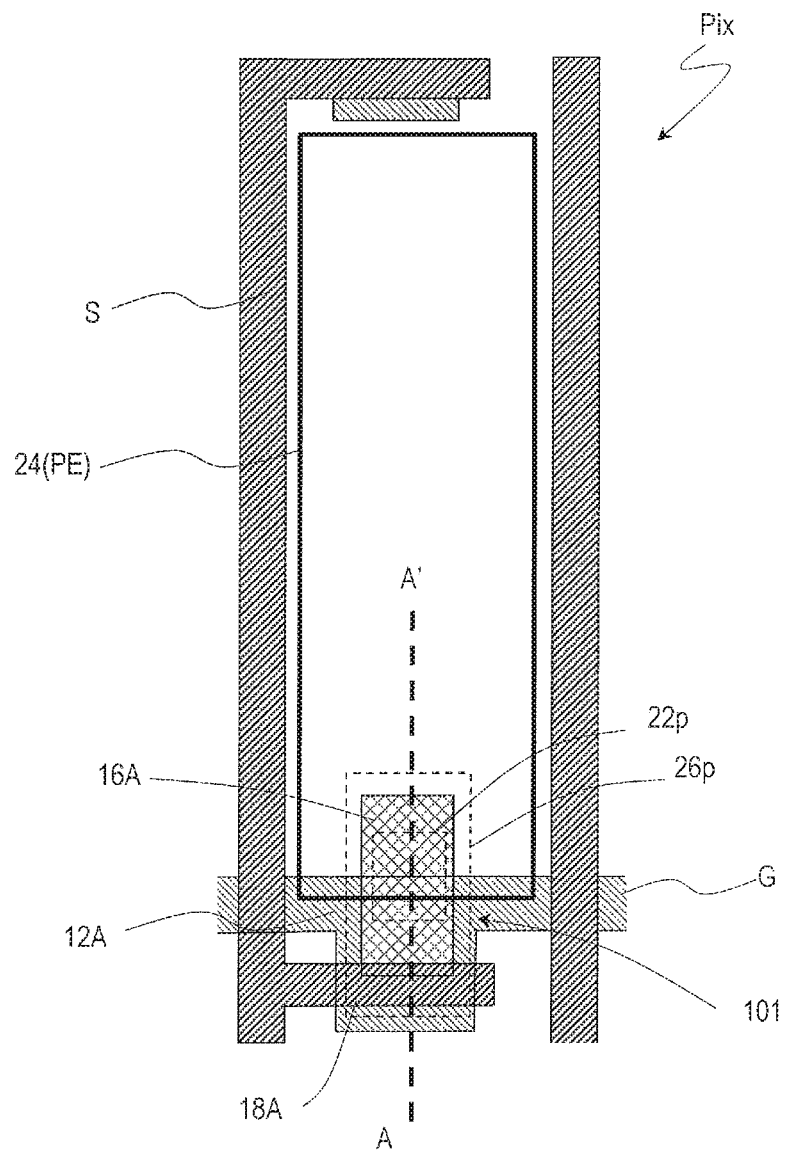
FIG. 1B is a plan view illustrating a pixel region of the semiconductor device 1001.

FIG. 1A(a) is a plan view schematically showing a portion of a semiconductor device (TFT substrate) 1001 of the first embodiment, and FIG. 1A(b) is a schematic cross-sectional view taken along line I-I' shown in FIG. 1(*a*). FIG. 1B is a plan view illustrating a pixel region Pix of the semiconductor device 1001. The semiconductor device 1001 is applied to liquid crystal display devices of an FFS (Fringe Field Switching) mode, for example. Note that elements having substantially the same function will be denoted by like reference numerals, and the description thereof may be omitted in the description below.

The semiconductor device 1001 includes a substrate 11, and includes, on the substrate 11, a plurality of pixel regions Pix, source lines S extending in the column direction and gate lines G extending in the row direction. The pixel regions Pix are arranged in a matrix pattern in the X direction (referred to also as the "row direction") and in the Y direction (referred to also as the "column direction") different from the X direction, and correspond to pixels of the liquid crystal display device.

Each pixel region Pix includes an oxide semiconductor TFT (hereinafter abbreviated simply as a "TFT") 101 supported on the substrate 11, a first insulating layer 22 covering the TFT 101, a first transparent electrode 24, a second transparent electrode 26, and a second insulating layer 28 arranged between the first and second transparent electrodes 24 and 26.

The first transparent electrode 24 and the second transparent electrode 26 are formed from a conductive film that is capable of allowing visible light to pass therethrough (that is light-transmissive). In the present embodiment, the first transparent electrode 24 is electrically connected the TFT 101, and functions as a pixel electrode PE. The second transparent electrode 26 functions as a common electrode CE, for example. A portion of the second transparent electrode 26 may overlap the first transparent electrode 24 with the second insulating layer 28 therebetween, forming a storage capacitor.

The TFT 101 is a bottom gate-type TFT having a top contact structure, for example. The TFT 101 includes a gate electrode 12A, a metal oxide layer 16A, a gate insulating layer 14 arranged between the gate electrode 12A and the metal oxide layer 16A, and a source electrode 18A in contact with the upper surface of the metal oxide layer 16A. The metal oxide layer 16A includes a semiconductor region in which a channel region 16*c* is formed, and a source contact region 16*s* and a drain contact region 16*d* arranged on opposite sides of the channel region 16*c*. The channel region 16*c* is arranged so as to overlap the gate electrode 12A with the gate insulating layer 14 therebetween. The source contact region 16*s* is in contact with the source electrode 18A. The drain contact region 16*d* is in contact with the first transparent electrode 24.

Note that in the present specification, an electrode (source electrode) 18A that is in contact with the source contact region 16*s* of the metal oxide layer 16A is referred to as the "first electrode", and a transparent electrode (herein, the first transparent electrode 24) that is in contact with the drain contact region 16*d* is referred to as the "second electrode". The second electrode may be the pixel electrode PE or a connecting electrode that connects between the pixel electrode PE and the metal oxide layer 16A.

The gate electrode 12A is connected to a corresponding gate line G, and the source electrode 18A is connected to a corresponding source line S. As shown in the figures, the gate electrode 12A and the gate line G may be formed integral together, and the source electrode 18A and the source line S may be formed integral together.

A "metal oxide layer" as used in the present specification is a layer that includes a semiconductor region functioning as the active layer of the oxide semiconductor TFT. The metal oxide layer in some cases includes a region where the resistance is locally lowered (a low resistance region or a conductor region). For example, when the metal oxide layer is in contact with a conductor layer such as a metal layer or a reducing insulative layer, a portion of the surface of the metal oxide layer that is in contact with the conductor layer becomes a low resistance region that has a lower electric resistance than the semiconductor region. The resistance of only the surface of the metal oxide layer may be lowered in some cases, and the resistance of the metal oxide layer may be lowered across the thickness direction thereof in other cases. Such a metal oxide layer can be formed from an oxide semiconductor film, for example. In the process of manufacturing a semiconductor device, a portion of the oxide semiconductor film may become a low resistance region where the resistance is lowered while the rest remains as a semiconductor region.

As shown in FIG. 1A(a), in this example, the first insulating layer 22 includes an opening (first opening) 22*p* through which a portion of the metal oxide layer 16A is exposed. A portion 17 of the metal oxide layer 16A that is exposed through the opening 22*p* is referred to as the "exposed region". In the present embodiment, the opening 22*p* is a "pixel contact hole" for connecting the first transparent electrode 24, which functions as a pixel electrode, to the metal oxide layer 16A. The arrangement and the planar shape of the pixel contact holes described in the present specification refer to those of the "bottom surfaces" of the pixel contact holes (herein, the arrangement and the planar shape of the exposed regions 17), irrespective of the inclination angle of the side wall of the pixel contact holes.

The first transparent electrode 24 is formed in the opening 22*p* of the metal oxide layer 16A and on the first insulating layer 22, and is in contact with a portion of the exposed region 17 in the opening 22*p*. Therefore, a portion of the exposed region 17 of the metal oxide layer 16A becomes the drain contact region 16*d*. The channel region 16*c* is located between the drain contact region 16*d* and the source contact region 16*s*, and at least includes a portion that is in contact with the first insulating layer 22. As seen from the direction normal to the substrate 11, a channel region 16*c*-side end portion of the first transparent electrode 24 extends across the exposed region 17. Therefore, as seen from the direction normal to the substrate 11, the first transparent electrode 24 does not overlap the channel region 16*c* of the metal oxide layer 16A. A portion 19 of the exposed region 17 of the metal oxide layer 16A that is not in contact with the first transparent electrode 24 (i.e., a portion of the drain contact region 16*d* that is located on the source side) may be in contact with the second insulating layer 28. The second insulating layer 28 may be a reducing insulative layer (e.g., an SiNx layer) that has a capability of reducing the metal oxide layer 16A, for example. In such a case, the portion 19 of the metal oxide layer 16A that is in contact with the second insulating layer 28 is reduced by the second insulating layer 28 so that the resistance thereof is lowered, thereby becoming a low resistance region having a lower electric resistance than the channel region 16*c*.

The second transparent electrode 26 may have an opening 26*p* over the TFT 101. As seen from the direction normal to the substrate 11, the TFT 101 (the metal oxide layer 16A) may be arranged inside the opening 26*p*. Note that FIG.

1A(a) and FIG. 1B do not show the second transparent electrode 26, but only show the opening 26p of the second transparent electrode 26. The second transparent electrode 26 may cover the entire pixel region Pix (excluding a portion at which the opening 26p is located).

Note that the second insulating layer 28 may not be a reducing insulative layer, but may be an oxygen-containing insulating layer (an SiOx layer, etc.), for example. In such a case, the portion 19 of the metal oxide layer 16A that is in contact with the second insulating layer 28 remains as a semiconductor region, becoming a part of the channel region 16c.

The metal oxide layer 16A may include tin (Sn), and the first transparent electrode 24 may not include tin. For example, the metal oxide layer 16A may include an oxide including indium, tin and zinc (e.g., an In—Sn—Zn—O-based oxide), and the first transparent electrode 24 may include an indium-zinc oxide (In—Zn—O). Thus, patterning for forming the first transparent electrode 24 can be done by wet etching, as will be described later.

The TFT 101 may have a channel-etch structure, or may have an etch stop structure having an etch stop that covers the channel region. With a "channel-etch type TFT", as shown in FIG. 1A(b), an etch stop layer is not formed over the channel region 16c, and the lower surface of the channel-side end portion of each of the source electrode 18A and the drain electrode (herein, the first transparent electrode) is arranged so as to be in contact with the upper surface of the metal oxide layer 16A. A channel-etch type TFT is formed by, for example, forming a source conductive film on the metal oxide layer 16A, and patterning the conductive film. In this process, a surface portion of the channel region may be etched. On the other hand, an etch stop-type TFT is formed by, for example, forming an etch stop layer that covers a portion of the metal oxide layer 16A to be the channel region 16c, and then forming and patterning a source conductive film on the metal oxide layer 16A and the etch stop layer. Therefore, the lower surface of a channel-side end portion of the source electrode 18A is located on the etch stop layer, for example.

Advantageous Effects of Present Embodiment

The semiconductor device 1001 of the present embodiment has advantageous effects as follows.

In the semiconductor device 1001, as seen from the direction normal to the substrate 11, the first transparent electrode 24, which is the pixel electrode PE, is arranged so as not to overlap the channel region 16c of the TFT 101, and it is therefore possible to suppress the electric influence of the voltage of the pixel electrode PE on the TFT 101. As a result, it is possible to suppress the variation of the TFT characteristics (the threshold voltage Vth) due to the voltage of the pixel electrode PE. Therefore, there is obtained the semiconductor device 1001 having a high reliability.

In the present embodiment, the pixel pitch can be shortened as compared with a case in which source and drain electrodes are formed by patterning the same conductive film. Moreover, since the pixel contact portion that connects between the pixel electrode PE and the metal oxide layer 16A can be formed from only a light-transmissive material, the ratio of the light-transmitting region with respect to the pixel region Pix (the pixel aperture ratio) can be increased as compared with a case in which the drain electrode is formed by using a metal film.

The first insulating layer 22 may be formed from an inorganic insulative material, and may not include an organic insulating layer. Alternatively, it may not include a flattening layer made of an organic or inorganic insulative material. Then, it is possible to further reduce the thickness of the first insulating layer 22, and thus to reduce the depth of the pixel contact hole.

With the conventional structure described above with reference to FIG. 23, when the interlayer insulating film between the pixel electrode and the channel region is thin, the channel region is more likely to be influenced by the voltage of the pixel electrode. In contrast, with the present embodiment, since the pixel electrode PE and the channel region 16c do not overlap each other with the first insulating layer 22 therebetween, the threshold voltage does not vary even when the first insulating layer 22 is made thin. Thus, particularly significant advantageous effects are obtained when the first insulating layer 22 is thin. For example, when the thickness of the first insulating layer 22 is less than 500 nm or when the volume ratio of the interlayer insulating film formed between the pixel electrode and the channel region with respect to the gate insulating layer is greater than or equal to ⅒, it is possible to more effectively suppress the variation of the threshold voltage.

Example of the Invention and Comparative Example

Figure 23:
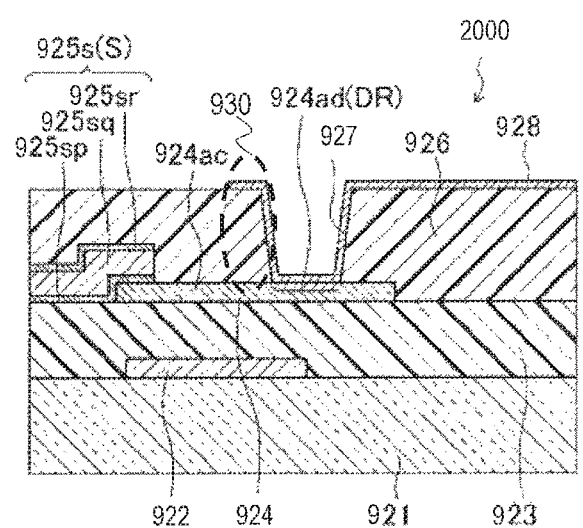
FIG. 23 is a cross-sectional view illustrating a conventional TFT substrate 2000 disclosed in Patent Document No. 1.

A TFT substrate of an example of the invention having a structure shown in FIG. 1A and FIG. 1B, and a TFT substrate of a comparative example having a structure shown in FIG. 23 were manufactured, and the variation of the TFT characteristics due to the voltage of the pixel electrode was examined. An In—Sn—Zn—O-based oxide layer was used as the metal oxide layer, an indium-zinc oxide (In—Zn—O) layer as the pixel electrode, and an $SiN/SiO_2$ layer (thickness: 150 nm/300 nm) as the interlayer insulating film arranged between the pixel electrode and the metal oxide layer.

Figure 2:
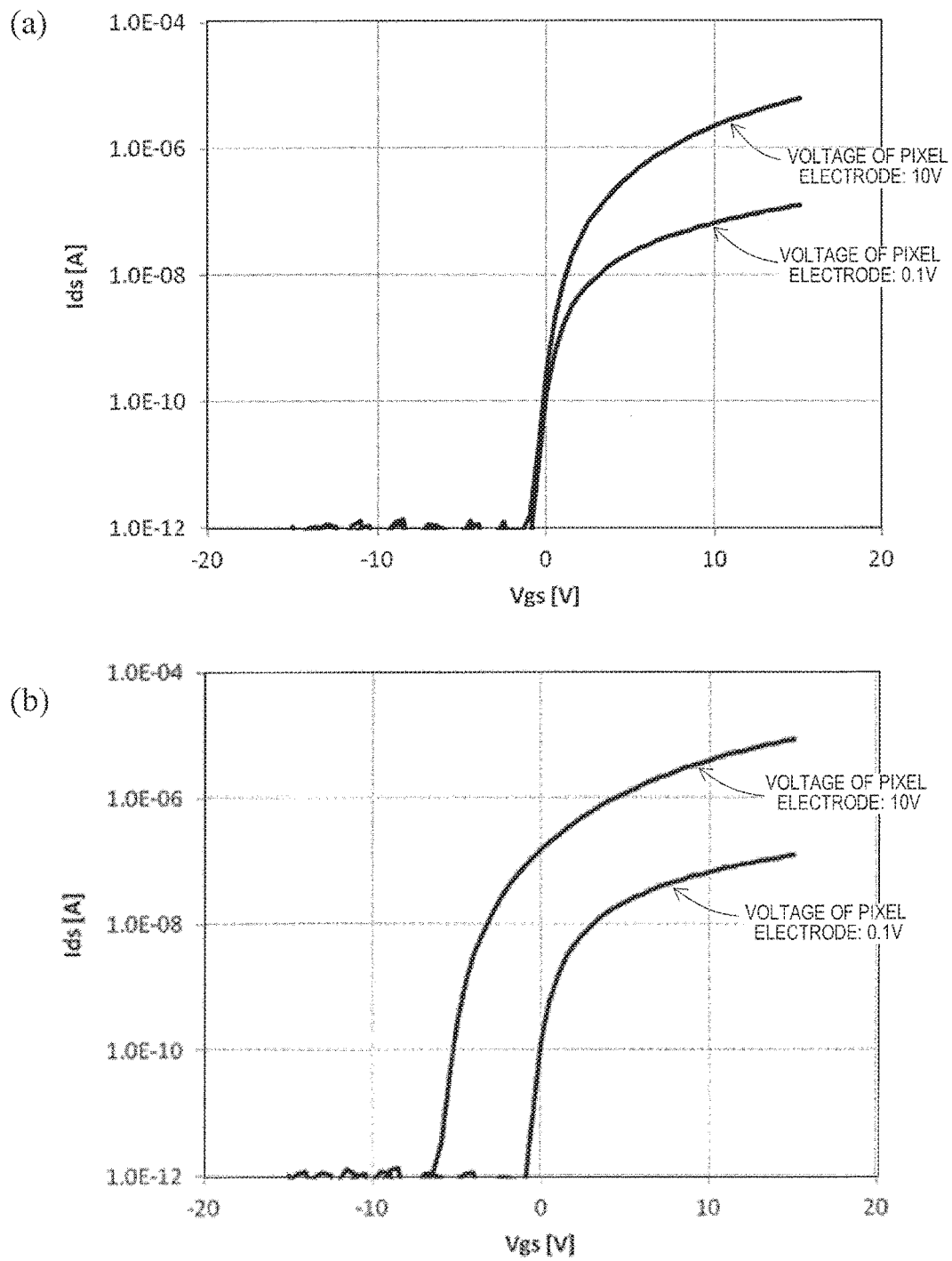
FIGS. 2(a) and 2(b) are graphs illustrating measurement results of TFT characteristics for an example of the invention and a comparative example, respectively.

FIGS. 2(a) and 2(b) are graphs illustrating results of TFT characteristics for the example of the invention and the comparative example, respectively. Herein, the current-voltage characteristics of the TFTs were measured while varying the voltage of the pixel electrode.

As can be seen from FIG. 2(b), with the TFT substrate of the comparative example, the threshold voltage Vth of the TFT varies significantly depending on the voltage of the pixel electrode. Specifically, when the voltage of the pixel electrode is 10 V, the threshold voltage Vth is shifted toward the negative side, as compared with 0.1 V. It is believed that this is because since the pixel electrode is arranged so as to cover the channel region with the interlayer insulating film therebetween, the voltage of the pixel electrode influences the channel region. In contrast, with the TFT substrate of the example of the invention, the measurement results of FIG. 2(a) confirm that the threshold voltage Vth of the TFT does not substantially vary even when the voltage applied to the pixel electrode changes.

(Description of Metal Oxide Layer 16A)

Now, the metal oxide layer 16A used in the present embodiment will be described. The metal oxide layer 16A is formed from an oxide semiconductor film. The oxide semiconductor film may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor whose c-axis is oriented generally perpendicular to the layer surface.

The metal oxide layer 16A may have a layered structure including two or more layers. When the metal oxide layer 16A has a layered structure, the semiconductor region of the metal oxide layer 16A may include a non-crystalline oxide semiconductor layer and a crystalline oxide semiconductor layer. Alternatively, it may include a plurality of crystalline oxide semiconductor layers having different crystalline structures. It may include a plurality of non-crystalline oxide semiconductor layers. When the metal oxide layer 16A has a two-layer structure including an upper layer and a lower layer, it is preferred that the energy gap of the oxide semiconductor included in the upper layer is greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer.

The material, the structure, the film formation method of the non-crystalline oxide semiconductor and each of the crystalline oxide semiconductors, and the configuration of an oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

The metal oxide layer 16A may at least include one metal element from among In, Ga and Zn, for example. In the present embodiment, the metal oxide layer 16A includes an In—Ga—Zn—O-based oxide (e.g., indium gallium zinc oxide), for example. Now, the In—Ga—Zn—O-based oxide is a ternary oxide of In (indium), Ga (gallium) and Zn (zinc), and there is no particular limitation on the ratio (composition ratio) between In, Ga and Zn, examples of which include In:Ga:Zn=2:2:1, In:Ga:Zn=1:1:1 and In:Ga:Zn=1:12A, for example. Such a metal oxide layer 16A can be formed from an oxide semiconductor film including an In—Ga—Zn—O-based semiconductor. Note that a channel-etch type TFT having an active layer including an oxide semiconductor such as an In—Ga—Zn—O-based semiconductor is in some cases referred to as a "CE-OS-TFT".

The in-Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally perpendicular to the layer surface.

Note that crystalline structures of crystalline In—Ga—Zn—O-based semiconductors are disclosed in, for example, Japanese Laid-Open Patent Publication No. 2014-007399, supra, Japanese Laid-Open Patent Publication No. 2012-134475, Japanese Laid-Open Patent Publication No. 2014-209727, etc. The disclosures of Japanese Laid-Open Patent Publication No. 2012-134475 and Japanese Laid-Open Patent Publication No. 2014-209727 are herein incorporated by reference in their entirety. Since TFTs including an In—Ga—Zn—O-based semiconductor layer have a high mobility (more than 20 times that of an a-SiTFT) and a low leak current (less than 1/100 that of an a-SiTFT), they can desirably be used as driver TFTs (e.g., TFTs included in driver circuits provided around the display region including a plurality of pixels and on the same substrate as the display region) and pixel TFTs (TFTs provided in pixels).

The semiconductor region of the metal oxide layer 16A may include another oxide semiconductor instead of an In—Ga—Zn—O-based semiconductor. For example, it may include an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin) and Zn (zinc). Alternatively, the metal oxide layer 16A may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, or the like.

In the present embodiment, it is preferred that a tin-containing oxide layer such as In—Sn—Zn—O-based oxide or In—Al—Sn—Zn—O-based oxide is used as the metal oxide layer 16A, and a non-tin-containing conductive film such as an indium-zinc oxide is used as the transparent conductive film to be in contact with the drain contact region of the metal oxide layer 16A. Then, it is possible to etch the transparent conductive film on the metal oxide layer 16A without removing the metal oxide layer 16A by using a phosphate-based etchant, for example.

(Configuration of Display Region and Frame Region)

Next, the configuration of the display region and the frame region of the semiconductor device 1001 will be described in greater detail.

Figure 3:
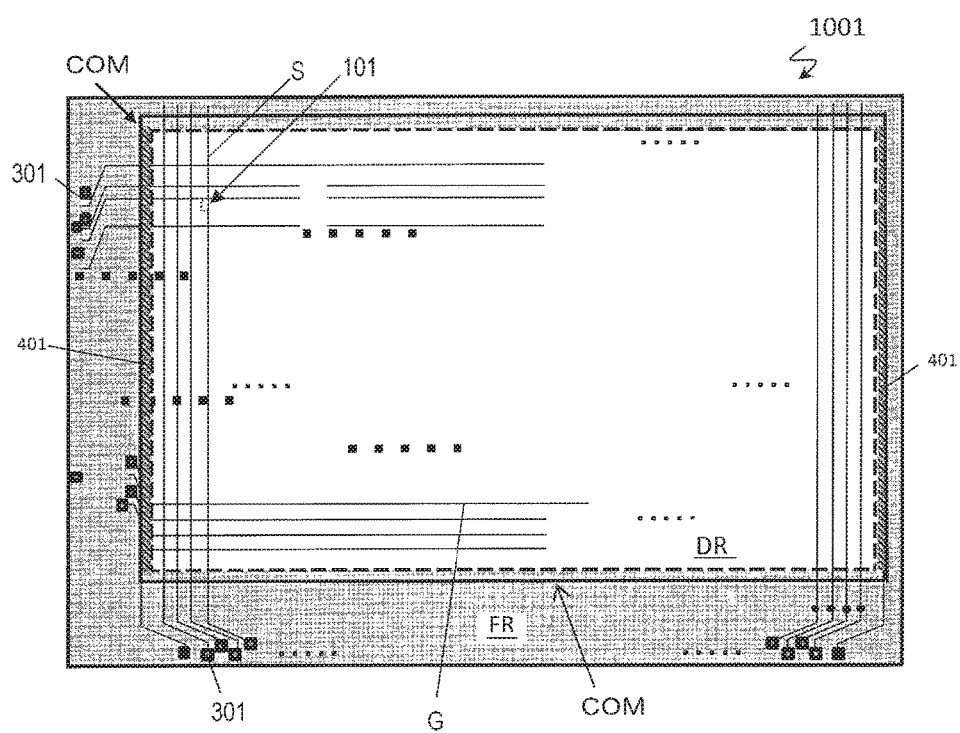
FIG. 3 is a plan view schematically showing the semiconductor device 1001.

FIG. 3 is a plan view schematically showing the semiconductor device 1001.

The semiconductor device 1001 has a display region DR that contributes to display, and a region (called the "frame region" or the "bezel region") FR other than the display region DR.

The display region DR a plurality of pixel regions Pix. A plurality of gate lines G and a plurality of source lines S are formed in the display region DR, and each region delimited by these lines is a "pixel region Pix". The plurality of pixel regions Pix may be arranged in a matrix pattern.

As described above with reference to FIG. 1B, the pixel electrode PE, the common electrode CE and the TFT 101 are formed in each pixel region Pix. The common electrode CE may not be separated for each pixel region Pix. For example, it may be formed so as to cover a plurality of pixel regions Pix, extending over gate lines G and source lines S.

The frame region FR may include provided therein gate lines G and source lines S extracted from the display region DR, common lines COM, terminal portions 301 each for electrically connecting a source line S or a gate line G to an external line, driver circuits, etc. The driver circuits may be formed integral with TFTs 101, or the like, on the substrate 11 (driver monolithic). In such a case, TFTs of driver circuits (called "circuit TFTs") and TFTs provided in the pixel regions Pix (called "pixel TFTs") 101 may be formed by using the same semiconductor film.

The common electrode CE is connected to the common line COM by a common contact portion 401. The common contact portion may be provided in the frame region FR.

Figure 4:
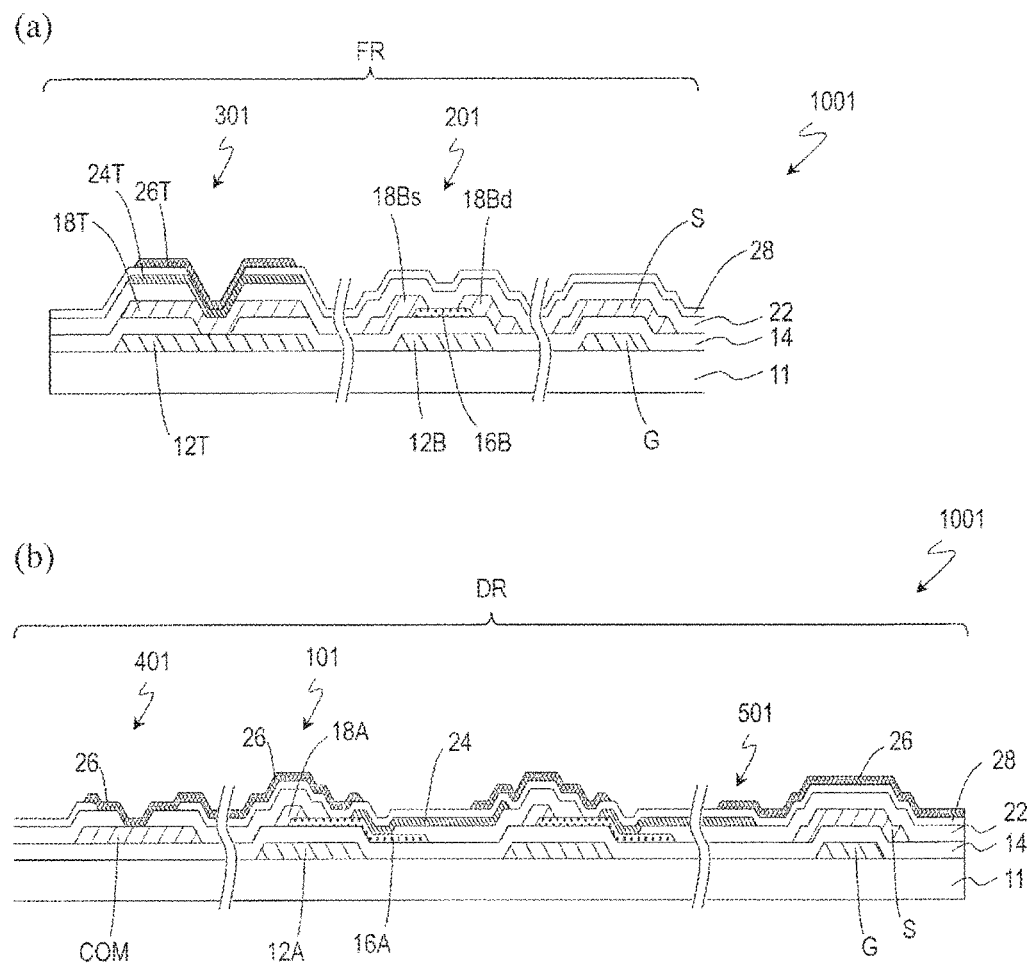
FIGS. 4(a) and 4(b) are cross-sectional views showing a portion of a cross-sectional structure of a frame region FR and a display region DR, respectively, of the semiconductor device 1001.
Figure 5:
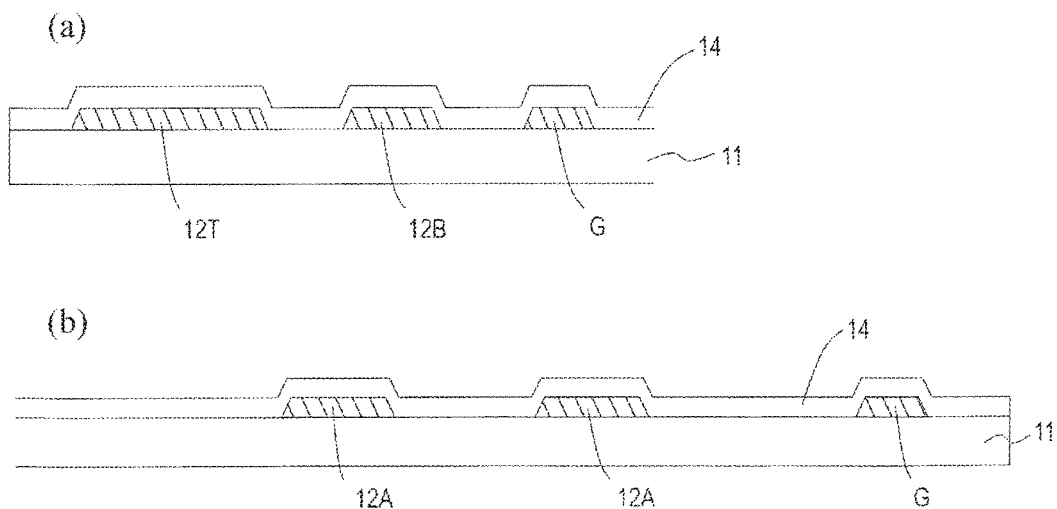
FIGS. 5(a) and 5(b) are schematic process step cross-sectional views illustrating a method for manufacturing the semiconductor device 1001, wherein (a) shows a portion of the frame region FR and (b) shows a portion of the display region DR.
Figure 6:
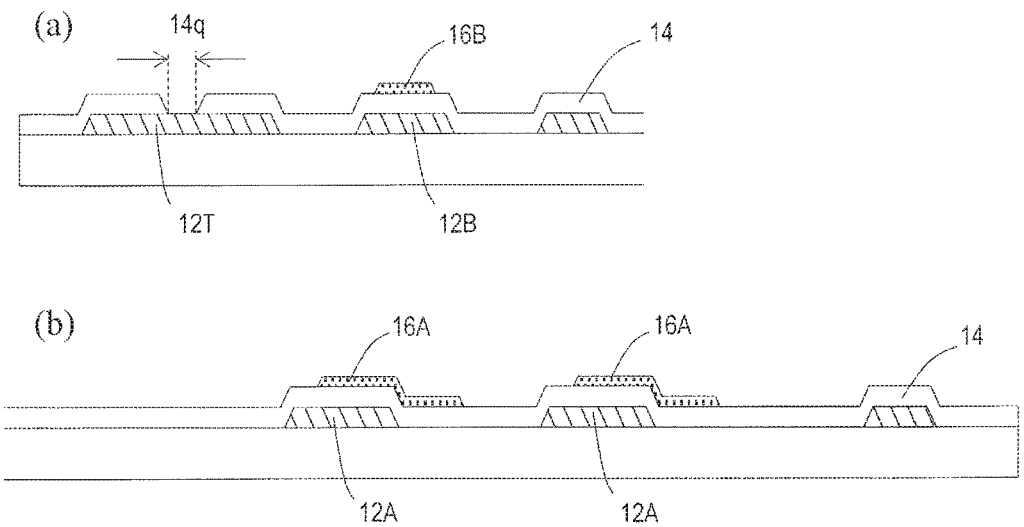
FIGS. 6(a) and 6(b) are schematic process step cross-sectional views illustrating the method for manufacturing the semiconductor device 1001, wherein (a) shows a portion of the frame region FR and (b) shows a portion of the display region DR.
Figure 7:
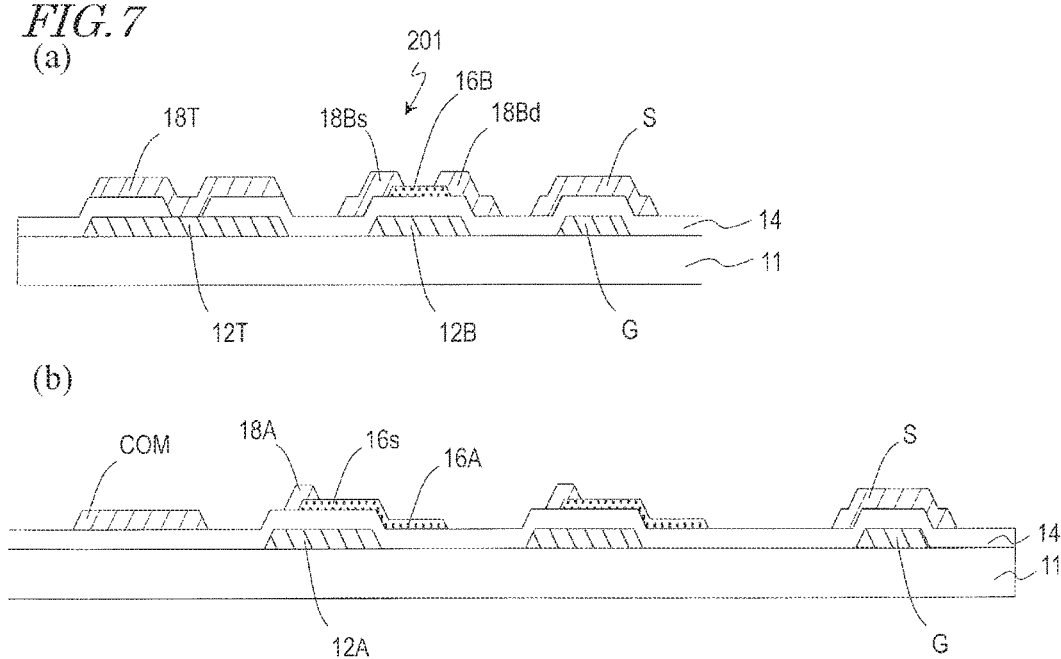
FIGS. 7(a) and 7(b) are schematic process step cross-sectional views illustrating the method for manufacturing the semiconductor device 1001, wherein (a) shows a portion of the frame region FR and (b) shows a portion of the display region DR.
Figure 8:
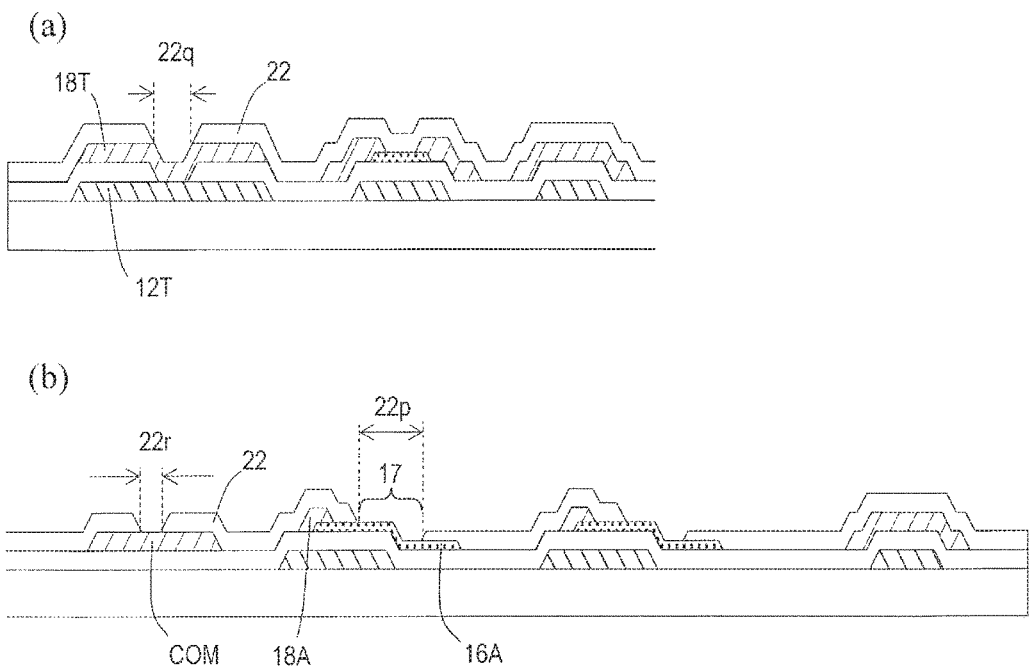
FIGS. 8(a) and 8(b) are schematic process step cross-sectional views illustrating the method for manufacturing the semiconductor device 1001, wherein (a) shows a portion of the frame region FR and (b) shows a portion of the display region DR.
Figure 9:
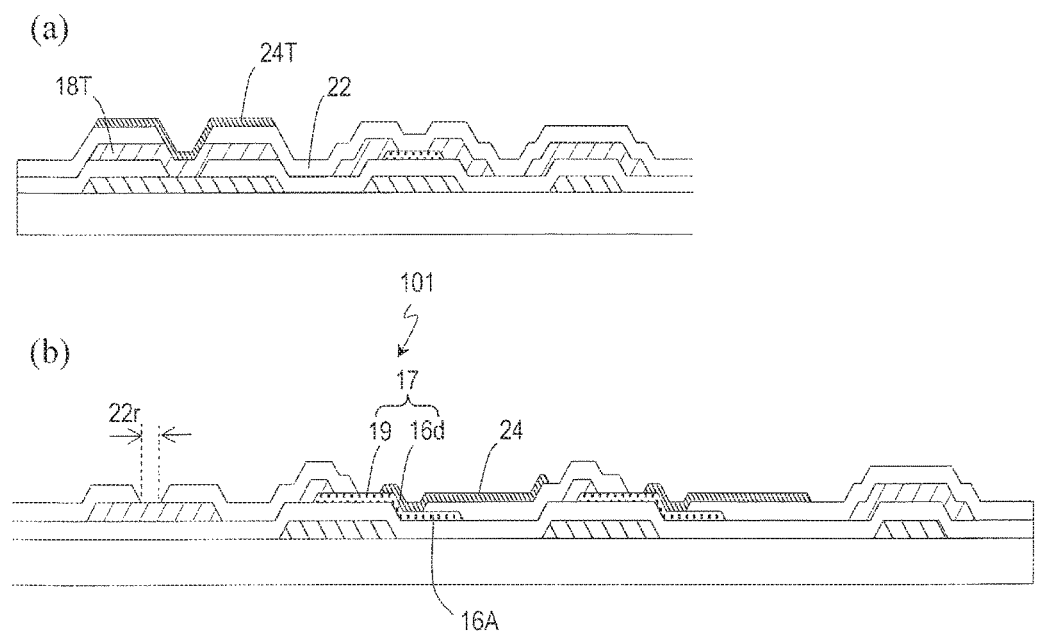
FIGS. 9(a) and 9(b) are schematic process step cross-sectional views illustrating the method for manufacturing the semiconductor device 1001, wherein (a) shows a portion of the frame region FR and (b) shows a portion of the display region DR.
Figure 10:
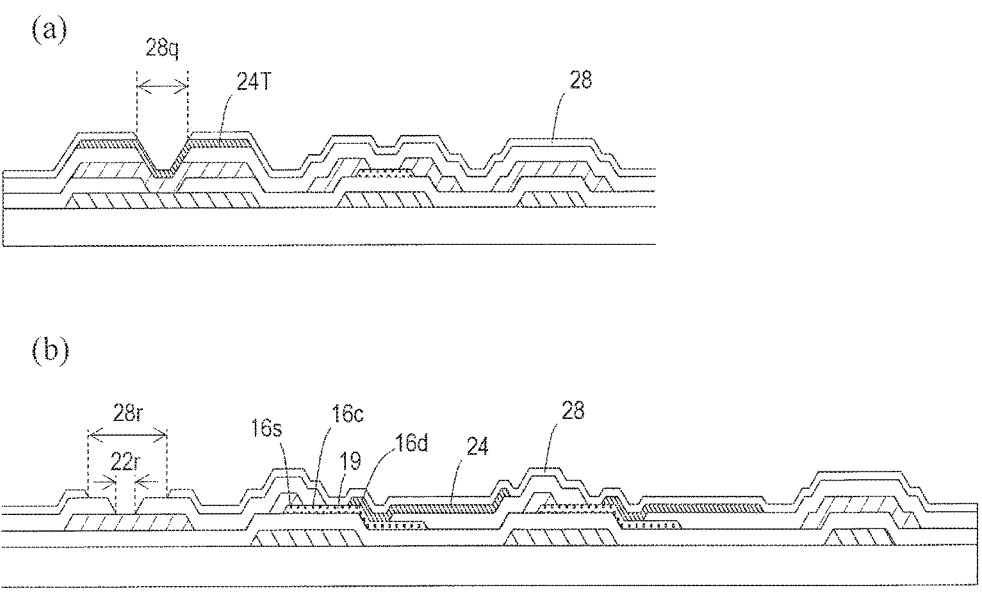
FIGS. 10(a) and 10(b) are schematic process step cross-sectional views illustrating the method for manufacturing the semiconductor device 1001, wherein (a) shows a portion of the frame region FR and (b) shows a portion of the display region DR.

Next, referring to FIG. 4, the cross-sectional structures of the frame region FR and the display region DR of the semiconductor device 1001 will be described.

FIG. 4(a) is a cross-sectional view illustrating a circuit TFT 201, a terminal portion 301 and an intersection between a source line and a gate line in the frame region FR. FIG. 4(b) is a cross-sectional view illustrating a common contact portion 401 in the frame region FR, and a pixel TFT 101, a storage capacitor 501 and an intersection between a source line and a gate line in the display region DR.

The pixel TFT 101 has a structure described above with reference to FIG. 1. The circuit TFT 201 is different from the pixel TFT 101 in that the circuit TFT 201 includes a drain electrode 18Bd that is formed by using the same conductive film (typically, a metal film) as the source line S.

The circuit TFT 201 includes a gate electrode 12B formed on the substrate 11, a metal oxide layer 16B arranged on the gate electrode 12B with the gate insulating layer 14 therebetween, a source electrode 18Bs, and a drain electrode 18Bd. The source electrode 18Bs and the drain electrode 18Bd are arranged so as to be in contact with the upper surface of the metal oxide layer 16B. The circuit TFT 201 is covered by the first insulating layer 22 and the second insulating layer 28. The gate electrode 12B of the circuit TFT 201 is formed by using the same conductive film as the gate line G, and the metal oxide layer 16B is formed by using the same oxide film as the metal oxide layer 16A of the pixel TFT 101. The source electrode 18Bs and the drain electrode 18Bd are formed from the same conductive film as the source line S.

The terminal portion 301 includes a gate connecting portion 12T formed from the same conductive film as the gate line G, a source connecting portion 18T formed from the same conductive film as the source line S, a first transparent connecting portion 24T formed from the same conductive film as the first transparent electrode 24, and a second transparent connecting portion 26T formed from the same conductive film as the second transparent electrode 26. These connecting portions are electrically connected. Specifically, the second transparent connecting portion 26T is in contact with the first transparent connecting portion 24T in the opening formed in the second insulating layer 28, the first transparent connecting portion 24T is in contact with the source connecting portion 18T in the opening formed in the first insulating layer 22, and the source connecting portion 18T is in contact with the gate connecting portion 12T in the opening formed in the gate insulating layer 14.

The common contact portion 401 connects together the second transparent electrode 26, which is the common electrode CE, and the common line COM. In this example, the common line COM is formed so as to surround the display region DR. The second transparent electrode 26 is in contact with the common line COM in the opening of the first insulating layer 22 and the second insulating layer 28. Although the common line COM is formed from the same conductive film as the source line S in this example, it may be formed from the same conductive film as the gate line G.

The storage capacitor 501 may be formed in the display region DR. Herein, at least a portion of the second transparent electrode 26 is arranged so as to overlap the first transparent electrode 24 with the second insulating layer 28 therebetween, thereby forming the storage capacitor 501 in which the second insulating layer 28 is used as the dielectric.

(Method for Manufacturing Semiconductor Device 1001)

Next, an example of a method for manufacturing the semiconductor device 1001 will be described.

FIG. 5 to FIG. 10 are schematic process step cross-sectional views illustrating the method for manufacturing the semiconductor device 1001. In each figure, (a) shows a portion of the frame region FR of the semiconductor device 1001, and (b) shows a portion of the display region DR of the semiconductor device 1001.

First, as shown in FIGS. 5(a) and 5(b), a gate line layer is formed on the substrate 11, the gate line layer including the gate connecting portion 12T, the gate electrode 12B of the circuit TFT, the gate electrode 12A of the pixel TFT, and the gate line G. The gate electrode 12A and the gate line G may be formed integral with each other. Next, the gate insulating layer 14 is formed so as to cover the gate line layer.

Herein, a gate conductive film (thickness: 50 nm or more and 500 nm or less, for example) (not shown) is formed on a substrate (e.g., a glass substrate) 11 by a sputtering method, or the like. Next, the gate conductive film is patterned, thereby obtaining the gate connecting portion 12T, the gate electrodes 12A and 12B, and the gate line G.

The substrate 11 may be, for example, a glass substrate, a silicon substrate, a heat-resistant plastic substrate (resin substrate), or the like.

The gate conductive film may be, for example, a metal film including an element selected from among aluminum (Al), chromium (Cr), copper (Cu), tantalum (Ta), titanium (Ti), molybdenum (Mo) and tungsten (W), or an alloy film including one or more of these elements as its components. It may be a layered film including a plurality of films of some of these elements. For example, it may be a layered film having a three-layer structure of titanium film-aluminum film-titanium film, or a three-layer structure of molybdenum film-aluminum film-molybdenum film. Note that the gate conductive film is not limited to a three-layer structure, but may have a single-layer or two-layer structure or may have a layered structure of four or more layers. Herein, the gate conductive film is a layered film (W/TaN) whose upper layer is a W film (thickness: 5 to 500 nm) and whose lower layer is TaN (thickness: 5 to 100 nm).

The gate insulating layer 14 may suitably be a silicon oxide ($SiO_2$) layer, a silicon nitride (SiNx) layer, a silicon oxide nitride layer (SiOxNy; x>y) layer, a silicon nitride oxide (SiNxOy; x>y) layer, an aluminum oxide layer, a tantalum oxide layer, or the like. The gate insulating layer 14 may have a layered structure. Herein, by using a CVD method, for example, the gate insulating layer 14 having a layered film structure whose lower layer is a silicon nitride (SiNx) layer (thickness: 100 to 500 nm) and whose upper layer is a silicon oxide (SiOx) layer (thickness: 20 to 100 nm).

Next, as shown in FIGS. 6(a) and 6(b), an oxide semiconductor film (thickness: 20 nm or more and 200 nm or less, for example) is deposited on the gate insulating layer 14 by using a sputtering method, for example, and then the oxide semiconductor film is patterned, thereby forming island-shaped metal oxide layers 16A and 16B. As seen from the direction normal to the substrate 11, the metal oxide layers 16A and 16B are arranged so that portions thereof overlap the gate electrodes 12A and 12B, respectively, with the gate insulating layer 14 therebetween. Then, an opening 14q, through which a portion of the gate connecting portion 12T is exposed, is formed in the gate insulating layer 14.

The metal oxide layer 16B of the circuit TFT may be patterned so that a portion thereof that is located on the source side of the channel region and a portion thereof that is located on the drain side of the channel region have generally the same length (in the channel length direction). On the other hand, the metal oxide layer 16A of the pixel TFT may be patterned so that the length of a portion thereof that is located on the drain side of the channel region is greater than the length of a portion thereof that is located on the source side of the channel region. Then, the pixel contact hole can be made to have a large size, and it is therefore possible to increase the contact area between the pixel electrode and the metal oxide layer 16A. Note that in the present embodiment, since a portion of the transparent pixel electrode functions as the drain electrode and no metal electrode is used therefor, it is possible to ensure a high pixel aperture ratio even when the contact area is increased. As shown in the figures, the metal oxide layer 16A of the pixel TFT may extend from over the gate electrode 12A across the drain-side edge of the gate electrode 12A, as seen from the direction normal to the substrate 11. In other words, as seen from the direction normal to the substrate 11, the source-side end portion of the metal oxide layer 16A may overlap the gate electrode 12A whereas the drain-side end portion thereof may not overlap the gate electrode 12A.

The oxide semiconductor film may be a film made of one of the oxide semiconductors described above ($TiO_2$, ZnO, $SnO_2$, $Ga_2O_3$, $In_2O_3$, NiO, etc.), or a layered film including a plurality of semiconductor films selected from among the oxide semiconductors described above. Moreover, it may be a layered film including semiconductor films of different compositions. Herein, an oxide semiconductor film (thickness: 20 to 200 nm) at least including In, Sn and Zn is formed as the oxide semiconductor film. The oxide semiconductor film may have a layered structure made of a plurality of semiconductor films. In such a case, when the semiconductor film of the uppermost layer is an oxide semiconductor film including In, Sn and Zn, it is possible to advantageously use wet etching in the step of patterning the source conductive film to be described later. For example, an oxide semiconductor film including In, Sn and Zn (an In—Sn—Zn—O-based semiconductor film, or the like) may be used for the upper layer, and an oxide semiconductor film at least including In, Ga and Zn (e.g., an In—Ga—Zn—O-based semiconductor film, or the like) may be used for the lower layer. If an In—Ga—Zn—O-based semiconductor film is used for the lower layer, it is possible to suppress the aging as compared with a case in which an In—Sn—Zn—O-based semiconductor film is used as a single layer, and it is therefore possible to realize more stable TFT characteristics.

Next, as shown in FIGS. 7(a) and 7(b), a source conductive film (thickness: 50 nm or more and 500 nm or less, for example) is formed on the metal oxide layers 16A and 16B and the gate insulating layer 14 and the source conductive film is patterned, thereby forming a source line layer including the source connecting portion 18T, the source line S, the source electrode 18Bs and the drain electrode 18Bd of the circuit TFT, the source electrode 18A of the pixel TFT, the common line COM, etc.

The source connecting portion 18T is arranged so as to be in contact with the gate connecting portion 12T in the opening 14q of the gate insulating layer 14. The source electrode 18Bs and the drain electrode 18Bd are each arranged so as to be in contact with the upper surface of the metal oxide layer 16B. The source electrode 18A is arranged so as to be in contact with the upper surface of the metal oxide layer 16A.

The source conductive film may be, for example, an element selected from among aluminum (Al), chromium (Cr), copper (Cu), tantalum (Ta), titanium (Ti), molybdenum (Mo) and tungsten (W), or an alloy including one or more of these elements as its components. For example, it may have a three-layer structure of titanium film-aluminum film-titanium film, a three-layer structure of molybdenum film-aluminum film-molybdenum film, or the like. Note that the source conductive film is not limited to a three-layer structure, but may have a single-layer or two-layer structure or may have a layered structure of four or more layers. Herein, for example, a layered film (Ti/Al/Ti) including a Ti film (thickness: 10 to 100 nm), an Al film (thickness: 50 to 400 nm) and a Ti film (thickness: 50 to 300 nm) layered in this order starting from the substrate 11 side may be used.

Next, as shown in FIGS. 8(a) and 8(b), the first insulating layer 22 is formed so as to cover the source line layer. Then, an opening 22q through which a portion of the source connecting portion 18T is exposed, an opening (pixel contact hole) 22p through which a region 17 including a portion of the metal oxide layer 16A to be the drain contact region is exposed, and an opening 22r through which a portion of the common line COM is exposed are formed in the first insulating layer 22.

The first insulating layer 22 may be a single layer or a layered structure of a silicon oxide film, a silicon nitride film, a silicon oxide nitride film, a silicon nitride oxide film, an aluminum oxide or a tantalum oxide. Preferably, the first insulating layer 22 is formed by using an inorganic insulating film. Herein, the first insulating layer 22 is a layered film whose lower layer is an $SiO_2$ film and whose upper layer is a silicon nitride (SiNx) film. For example, an $SiO_2$ film (thickness: 50 to 500 nm) may be formed by a CVD method, and then annealed for 0.5 to 4 hours at a temperature of 200° C. to 400° C. in an air atmosphere. Then, an SiNx layer (thickness: 50 to 500 nm) may be formed on an $SiO_2$ film.

Note that the first insulating layer 22 may be formed by using an organic insulating film. For example, it may have a layered structure of an organic insulating film and an inorganic insulating film. The first insulating layer 22 is preferably formed from only an inorganic insulating film, not including an organic insulating film. Then, the first insulating layer 22 can be made thin, and the depth of the pixel contact hole can be made small. Note that as described above, in the present embodiment, since the pixel electrode and the channel region are arranged so as not to overlap each other with the first insulating layer 22 therebetween, as seen from the direction normal to the substrate 11, it is possible to suppress the influence of the voltage of the pixel electrode on the channel region even if the first insulating layer 22 is thin.

Next, as shown in FIGS. 9(a) and 9(b), a first transparent conductive film (thickness: 20 to 300 nm) is formed on the first insulating layer 22 and in the openings 22q, 22p and 22r, and the first transparent electrode film is patterned, thereby forming the first transparent connecting portion 24T and the first transparent electrode 24. The first transparent connecting portion 24T is arranged so as to be in contact with the source connecting portion 18T in the opening 22q. The first transparent electrode 24 is arranged so as to be in contact with a portion of the exposed region 17 of the metal oxide layer 16A in the opening 22p.

The material of the first transparent electrode film may be a metal oxide such as indium-tin oxide (ITO), indium-zinc oxide and ZnO.

Herein, an indium-zinc oxide film (thickness: 20 to 300 nm) is formed as the first transparent conductive film by a sputtering method, for example. Then, the indium-zinc oxide film is patterned by using a phosphate-based etching solution. In this process, the metal oxide layers 16A and 16B including the In—Sn—Zn—O-based semiconductor remain unetched. When the metal oxide layers 16A and 16B at least includes tin (Sn) and the first transparent conductive film does not include Sn, as described above, it is possible to pattern only the first transparent conductive film by using a phosphate-based etching solution. Thus, as compared with a case in which dry etching is used, it is possible to reduce the damage imparted by the patterning on the metal oxide layers 16A and 16B.

Next, as shown in FIGS. 10(a) and 10(b), the second insulating layer 28 is formed on the substrate 11. Then, openings 28q and 28r are formed in the second insulating layer 28. The opening 28q is arranged so as to expose a portion of the first transparent connecting portion 24T. The opening 28r is arranged so as to at least partially overlap the opening 22r of the first insulating layer 22. Thus, a portion of the common line COM is exposed through the first and second insulating layers 22 and 28.

The second insulating layer 28 may be a single layer or a layered structure of a silicon oxide film, a silicon nitride film, a silicon oxide nitride film, a silicon nitride oxide film, an aluminum oxide or a tantalum oxide. Herein, an SiN film (thickness: 50 to 500 nm) is formed by a CVD method, for example, as the second insulating layer 28.

In this example, the second insulating layer 28 is in contact with an exposed region 19 of the metal oxide layer 16A. The region 19 refers to a region of the metal oxide layer 16A that is located between the source electrode 18A and the first transparent electrode 24 and is not in contact with the first insulating layer 22. If the second insulating layer 28 is an insulating film (e.g., an SiNx film) that has a property of reducing a metal oxide (herein, an In—Sn—Zn—O-based oxide) included in the metal oxide layer 16A, the region 19 is reduced, thereby lowering the resistance. On the other hand, if the second insulating layer 28 does not have such a property (e.g., an $SiO_2$ film), the region 19 remains as a semiconductor region and becomes a portion of the channel region.

Next, a second transparent conductive film is formed on the second insulating layer 28 and in the openings 28q and 28r. Then, the second transparent conductive film is patterned, thereby forming the second transparent connecting portion 26T and the second transparent electrode 26, which functions as the common electrode CE, on the second insulating layer 28 (see FIGS. 4(a) and 4(b)).

The material of the second transparent conductive film may be similar to the material of the first transparent conductive film. The second transparent conductive film may be a single layer or a layered film. Herein, an indium-zinc oxide film (thickness: 20 to 300 nm) is formed by a sputtering method, for example.

The second transparent connecting portion 26T is in contact with the first transparent connecting portion 24T in the opening 28q. The second transparent electrode 26 is arranged so as to be in contact with the common line COM in the opening 28r of the second insulating layer 28 and the opening 22r of the first insulating layer 22. The second transparent electrode 26 is provided with at least one opening (or cut-out portion) for each pixel. A portion of the second transparent electrode 26 may be arranged so as to overlap the first transparent electrode 24 with the second insulating layer 28 therebetween, thereby forming a storage capacitor. Thus, the semiconductor device 1001 is manufactured.

Second Embodiment

A structure of a semiconductor device of a second embodiment of the present invention will now be described with reference to the drawings.

The semiconductor device of the present embodiment is different from the semiconductor device 1001 of the first embodiment in that the second transparent electrode 26 functions as the pixel electrode PE, and a pixel contact hole is formed in the first insulating layer 22 and the second insulating layer 28. The pixel contact hole may be formed by etching the first insulating layer 22 and the second insulating layer 28 in one process.

Figure 11:
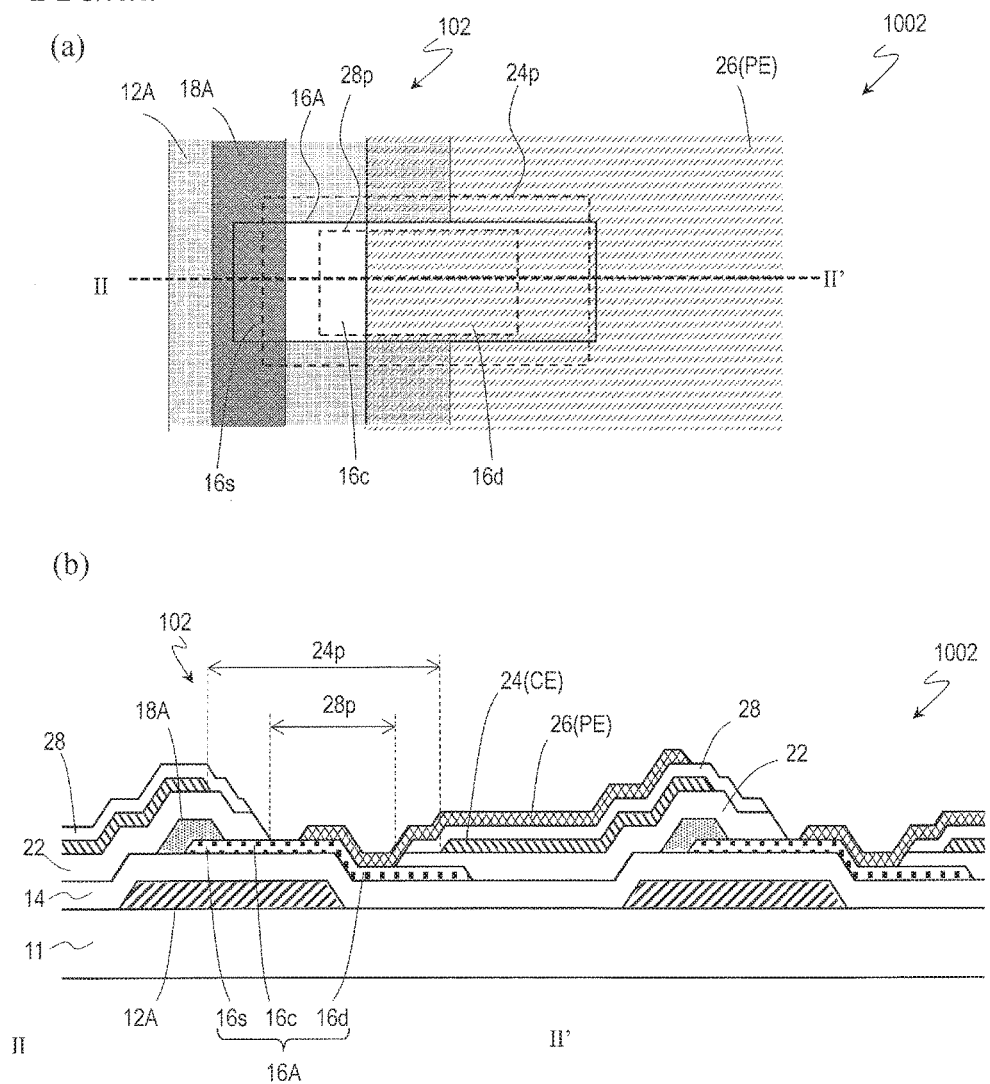
FIGS. 11(a) and 11(b) are a plan view and a cross-sectional view, respectively, schematically showing a portion of a semiconductor device (TFT substrate) 1002 of a second embodiment.

FIG. 11(a) is a plan view schematically showing a portion of a semiconductor device (TFT substrate) 1002 of the present embodiment, and FIG. 11(b) is a schematic cross-sectional view taken along line II-II' shown in FIG. 11(a). In FIG. 11, like elements to those of FIG. 1 are denoted by like reference signs and will not be described below.

Each pixel region Pix of the semiconductor device 1002 includes an oxide semiconductor TFT (hereinafter abbreviated as a "TFT") 102 supported on the substrate 11, the first insulating layer 22 covering the TFT 102, the first transparent electrode 24, the second transparent electrode 26, and the second insulating layer 28 arranged between the first and second transparent electrodes 24 and 26.

In the present embodiment, the second transparent electrode 26 functions as the pixel electrode PE. The second transparent electrode 26 is in contact with the metal oxide layer 16A of the TFT 102 in the pixel contact hole formed in the interlayer insulating film (herein, the first insulating layer 22 and the second insulating layer 28). Therefore, in the present embodiment, a portion of the second transparent electrode 26 functions also as the drain electrode. The first transparent electrode 24 functions as the common electrode CE, for example. A portion of the second transparent electrode 26 may overlap the first transparent electrode 24 with the second insulating layer 28 therebetween, forming a storage capacitor.

The second transparent electrode 26 is arranged so as to be in contact with a portion of a region (exposed region) of the metal oxide layer 16A that is exposed through an opening 28p. Therefore, a portion of the exposed region of the metal oxide layer 16A becomes the drain contact region 16d. The channel region 16c is located between the drain contact region 16d and the source contact region 16s, and at least includes a portion that is in contact with the first insulating layer 22. In this example, a region of the metal oxide layer 16A that is located between the drain contact region 16d and the source contact region 16s becomes the channel region 16c. As seen from the direction normal to the substrate 11, the channel region 16c-side end portion of the second transparent electrode 26 extends across the exposed region of the metal oxide layer 16A. Therefore, as seen from the direction normal to the substrate 11, the second transparent electrode 26 does not overlap the channel region 16c of the metal oxide layer 16A.

The opening 28p, which is the pixel contact hole, may be formed by etching the first insulating layer 22 and the second insulating layer 28 in one process. To "etch in one process" means to etch in a single etching step using the same mask. In this case, at the side wall of the opening 28p, the side wall of the first insulating layer 22 and the side wall of the second insulating layer 28 are aligned together.

The first transparent electrode 26 (CE) may have an opening 24p over the TFT 102. As seen from the direction normal to the substrate 11, at least the channel region 16c of the TFT 102 may be arranged inside the opening 24p. Note that FIG. 11(a) does not show the first transparent electrode 24, but only shows the opening 24p of the first transparent electrode 24.

The semiconductor device 1002 is suitably applied to FFS-mode display devices. Alternatively, it may be used in a liquid crystal display device that produces display in a VA (Vertical Alignment) mode. In such a case, the first transparent electrode 24 may be a storage capacitor electrode, and may form a transparent storage capacitor together with the second transparent electrode 26 and the second insulating layer 28. Alternatively, the first transparent electrode 24 may be absent.

In the present embodiment, since the second transparent electrode 26, which is the pixel electrode PE, is arranged so as not to overlap the channel region 16c of the TFT 102, it is possible to suppress the variation of the TFT characteristics (the threshold voltage Vth) due to the voltage of the pixel electrode PE. Moreover, as in the previous embodiment, the pixel pitch can be shortened. Furthermore, it is possible to increase the pixel aperture ratio as compared with a case in which the drain electrode is formed by using a metal film. Note however that in the present embodiment, since the pixel contact hole is deeper than the first embodiment, the liquid crystal alignment may be disturbed, in which case the pixel contact portion may be shaded.

In the present embodiment, by etching the first insulating layer 22 and the second insulating layer 28 at the same time, it is possible to reduce the number of photomasks used in the manufacturing process (the number of photo steps) as compared with that of the first embodiment. Moreover, in the present embodiment, the second transparent electrode 26, which is the upper layer, becomes the pixel electrode PE. Thus, since the common electrode CE is arranged between the pixel electrode PE and the source line S and between the pixel electrode PE and the gate line G, it is possible to reduce crosstalk.

Figure 12:
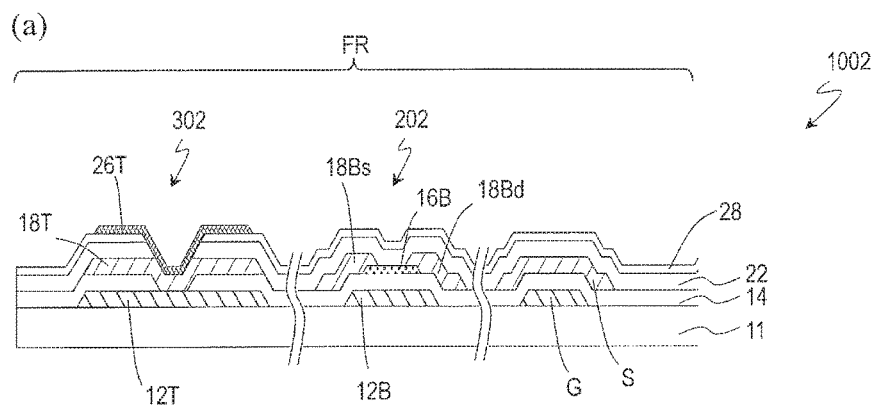
FIGS. 12(a) and 12(b) are cross-sectional views showing a portion of a cross-sectional structure of a frame region FR and a display region DR, respectively, of the semiconductor device 1002.
Figure 12:
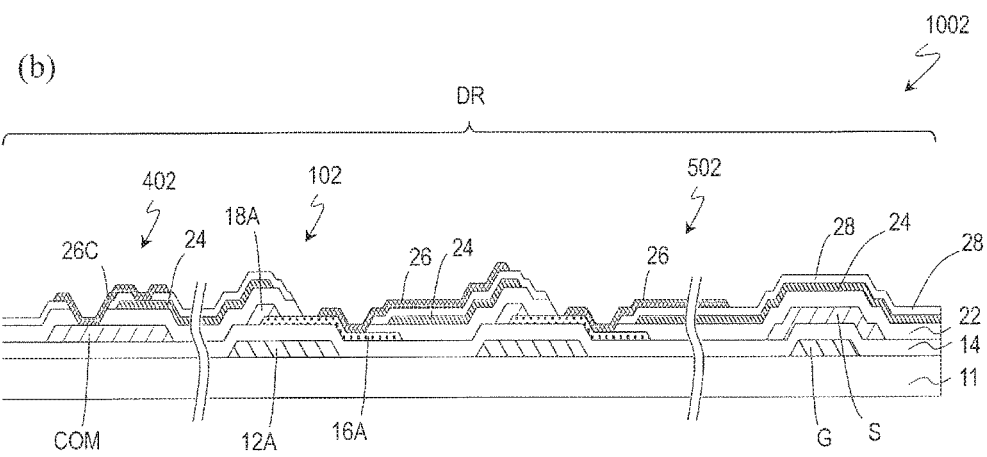

Referring to FIG. 12, cross-sectional structures of the frame region FR and the display region DR of the semiconductor device 1002 will be described in greater detail.

FIG. 12(a) is a cross-sectional view illustrating a circuit TFT 202, a terminal portion 302 and an intersection between a source line and a gate line in the frame region FR. FIG. 12(b) is a cross-sectional view illustrating a common contact portion 402 in the frame region FR, and a pixel TFT 102, a storage capacitor 502 and an intersection between a source line and a gate line in the display region DR.

The pixel TFT 102 has a structure described above with reference to FIG. 11. The circuit TFT 202 has a similar structure to that of the circuit TFT 201 described above with reference to FIG. 4.

The terminal portion 302 includes the gate connecting portion 12T formed from the same conductive film as the gate line G, the source connecting portion 18T formed from the same conductive film as the source line S, and the second transparent connecting portion 26T formed from the same conductive film as the second transparent electrode 26. These connecting portions are electrically connected. In the region where the terminal portion 302 is formed, the first transparent conductive film is removed and the first transparent connecting portion 24T is absent, which is different from the terminal portion 301 shown in FIG. 4.

Specifically, the second transparent connecting portion 26T is in contact with the source connecting portion 18T in an opening formed in the first insulating layer 22 and the second insulating layer 28, and the source connecting portion 18T is in contact with the gate connecting portion 12T in an opening formed in the gate insulating layer 14. In the present embodiment, since the first transparent conductive film (a transparent conductive film for forming the first transparent electrode 24) is removed from the region where the terminal portion 302 is formed, the opening can be formed by etching the second insulating layer 28 and the first insulating layer 22 in one process. In this case, the side wall of the second insulating layer 28 and the side wall of the first insulating layer 22 are aligned together.

The common contact portion 402 includes the first transparent electrode 24, which is the common electrode CE, the common line COM, a connecting portion (common contact connecting portion) 26C formed from the second transparent conductive film (a transparent conductive film for forming the second transparent electrode 26). In this example, the common contact connecting portion 26C is in contact with the common line COM in the opening formed in the first insulating layer 22 and the second insulating layer 28, and is in contact with the first transparent electrode 24 in the opening formed in the second insulating layer 28. Therefore, the first transparent electrode 24 is electrically connected the common line COM with the common contact connecting portion 26C therebetween.

In the display region DR, the storage capacitor 502 is formed from the first transparent electrode 24, the second transparent electrode 26 and the second insulating layer.

Next, an example of a method for manufacturing the semiconductor device 1002 will be described.

Figure 13:
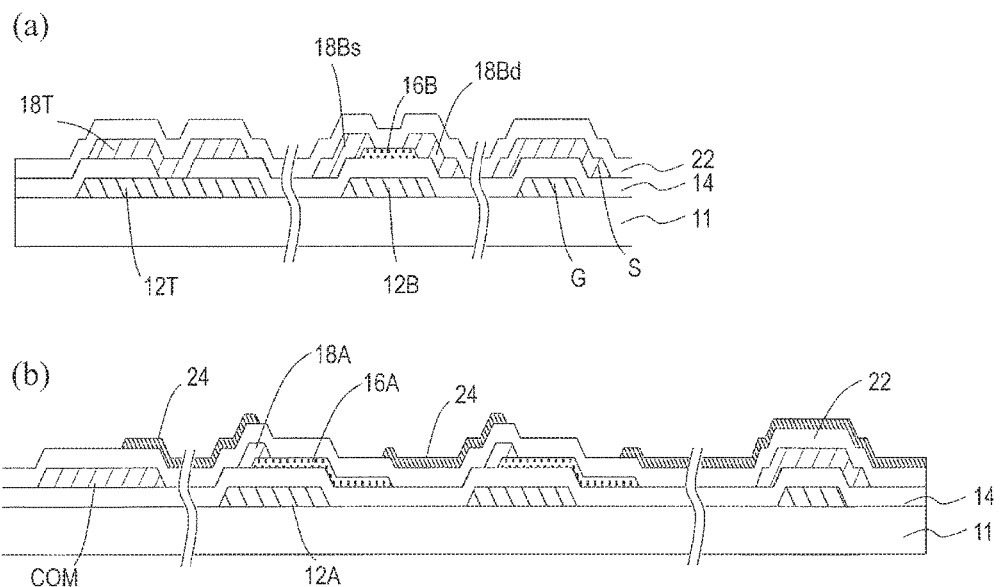
FIGS. 13(a) and 13(b) are schematic process step cross-sectional views illustrating a method for manufacturing the semiconductor device 1002, wherein (a) shows a portion of the frame region FR and (b) shows a portion of the display region DR.
Figure 14:
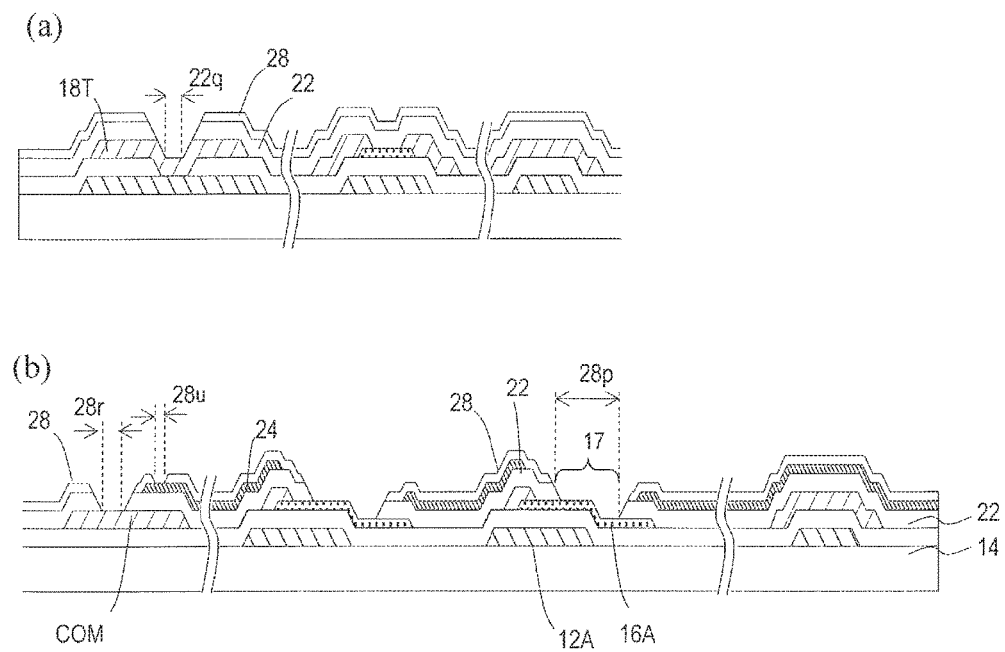
FIGS. 14(a) and 14(b) are schematic process step cross-sectional views illustrating the method for manufacturing the semiconductor device 1002, wherein (a) shows a portion of the frame region FR and (b) shows a portion of the display region DR.

FIG. 13 and FIG. 14 are schematic process step cross-sectional views illustrating the method for manufacturing the semiconductor device 1002. In each figure, (a) shows a portion of the frame region FR of the semiconductor device 1002, and (b) shows a portion of the display region DR of the semiconductor device 1002. The material, the thickness, the method of formation, etc., of each layer will not be described below if they are similar to those of the previous embodiment (FIG. 5 to FIG. 10).

As shown in FIGS. 13(a) and 13(b), a gate line layer, the gate insulating layer 14 covering the gate line layer, the metal oxide layer 16A, the metal oxide layer 16B, a source line layer, and the first insulating layer 22 covering the source line layer are formed on the substrate 11. The gate line layer includes the gate electrode 12A of the pixel TFT, the gate electrode 12B of the circuit TFT, and the gate line G. The source line layer includes the source electrode 18A, the source and drain electrodes 18Bs and 18Bd of the circuit TFT, the common line COM, and the source connecting portion 18T. Then, the first transparent conductive film is formed on the first insulating layer 22 and is patterned, thereby obtaining the first transparent electrode 24, which becomes the common electrode CE.

Next, as shown in FIGS. 14(a) and 14(b), the second insulating layer 28 is formed so as to cover the first insulating layer 22 and the first transparent electrode 24. Then, a resist mask (not shown) is provided on the second insulating layer 28, and the first insulating layer 22 and the second insulating layer 28 are etched. During the etching, the source conductive film, the oxide semiconductor film and the first transparent conductive film function as an etch stop. Through this etching, there are formed the opening 28q through which a portion of the source connecting portion 18T is exposed, the opening 28r through which a portion of the common line COM is exposed, an opening 28u through which a portion of the first transparent electrode 24 is exposed, and the opening 28p through which a portion of the metal oxide layer 16A is exposed. The opening 28p exposes a region 17 of the metal oxide layer 16A that includes a portion to be the drain contact region. The side surface of the first transparent electrode 24 is preferably covered by the second insulating layer 28.

Then, a second transparent conductive film is formed on the second insulating layer 28 and in the openings 28q, 28r, 28u and 28p and is patterned, thereby obtaining the second transparent connecting portion 26T, the common contact connecting portion 26C and the second transparent electrode 26 (see FIGS. 12(a) and 12(b)). A phosphate-based etchant may be used for the patterning, as in the previous embodiment.

The common contact connecting portion 26C is arranged so as to be in contact with the common line COM in the opening 28r and in contact with the first transparent electrode 24 in the opening 28u. The second transparent electrode 26 is arranged so as to be in contact with a portion of the exposed region 17 of the metal oxide layer 16A. Thus, the semiconductor device 1002 is manufactured.

Third Embodiment

A structure of a semiconductor device of a third embodiment of the present invention will now be described with reference to the drawings.

The semiconductor device of the present embodiment is different from the semiconductor device 1002 of the second embodiment in that the first transparent electrode 24 functions as the pixel electrode PE, and the pixel electrode PE is electrically connected to the metal oxide layer 16A with a pixel contact connecting portion (transparent connecting electrode) 26a therebetween, which is formed from the second transparent conductive film. The pixel contact hole may be formed by etching the first insulating layer 22 and the second insulating layer 28 in one process using the pixel electrode PE as an etch stop.

Figure 15:
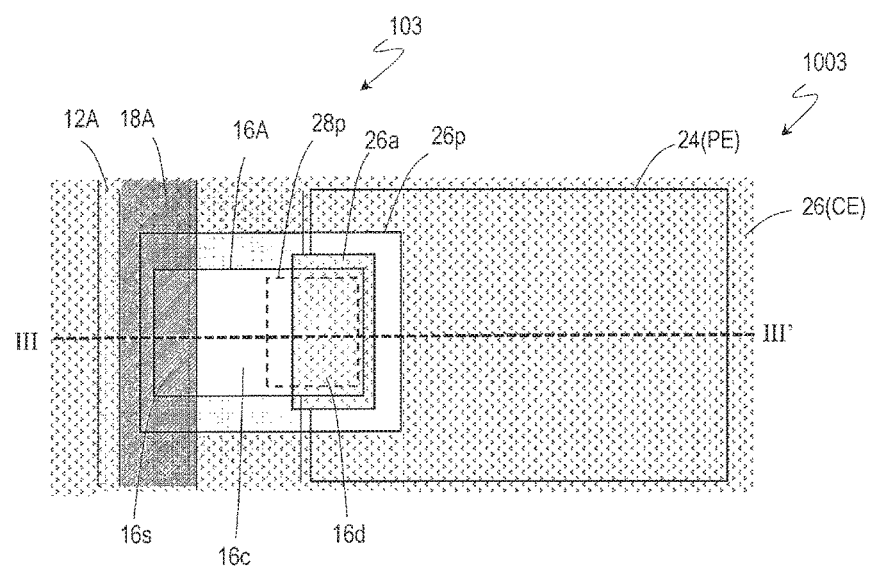
FIGS. 15(a) and 15(b) are a plan view and a cross-sectional view, respectively, schematically showing a portion of a semiconductor device (TFT substrate) 1003 of a third embodiment.
Figure 15:
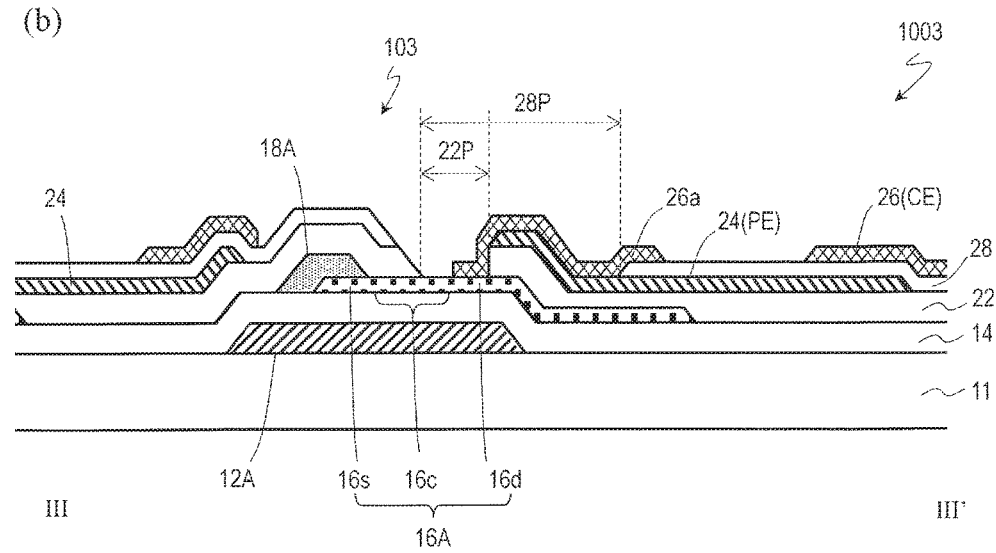

FIG. 15(a) a plan view schematically showing a portion of a semiconductor device (TFT substrate) 1003 of the present embodiment, and FIG. 15(b) is a schematic cross-sectional view taken along line III-III' shown in FIG. 15(a). In FIG. 15, like elements to those of FIG. 1 are denoted by like reference signs and will not be described below.

Each pixel region Pix of the semiconductor device 1003 includes a TFT 103 supported on the substrate 11, the first insulating layer 22 covering the TFT 103, the first transparent electrode 24, the second transparent electrode 26, the transparent connecting electrode 26a, and the second insulating layer 28 arranged between the first and second transparent electrodes 24 and 26. In the present embodiment, the first transparent electrode 24 is electrically connected the TFT 103, and functions as the pixel electrode PE. Although the transparent connecting electrode 26a is formed from the same conductive film as the second transparent electrode 26 (the second transparent conductive film), it is electrically separated from the second transparent electrode 26 and functions as the drain electrode. The second transparent electrode 26 functions as the common electrode CE, for example.

The configuration of the pixel contact portion of the present embodiment will be described.

In the pixel contact portion, the openings 22p and 28p are formed in the first insulating layer 22 and the second insulating layer 28. These openings 22p and 28p partially overlap each other, forming the pixel contact hole that exposes a portion of the metal oxide layer 16A and a portion of the first transparent electrode 24. These openings 22p and 28p may be formed by etching the first insulating layer 22 and the second insulating layer 28 in one process using the first transparent electrode 24 as an etch stop, for example. In this case, the side wall of the opening 22p of the first insulating layer 22 and the side wall of the opening 28p of the second insulating layer 28 are aligned together at a portion of the side wall of the pixel contact hole. A portion of the side wall of the opening 22p is aligned with the end surface of the first transparent electrode 24.

The transparent connecting electrode 26a is formed on the first insulating layer 22 and the second insulating layer 28, and is in contact with a portion of the metal oxide layer 16A in the opening 22p and in contact with the first transparent electrode 24 in the opening 28p. A portion of the metal oxide layer 16A that is in contact with the transparent connecting electrode 26a becomes the drain contact region 16d, and a region thereof that is located between the drain contact region 16d and the source contact region 16s becomes the channel region 16c.

In the present embodiment, as seen from the direction normal to the substrate 11, the channel region 16c-side end portion of the transparent connecting electrode 26a extends so as to cross the region that is exposed through the opening 28p (the pixel contact hole). The channel region 16c-side end portion of the first transparent electrode 24 is located on the first insulating layer 22. Therefore, as seen from the direction normal to the substrate 11, neither the first transparent electrode 24 nor the transparent connecting electrode 26a overlaps the channel region 16c of the metal oxide layer 16A.

The second transparent electrode 26, which functions as the common electrode, has the opening 26p over the TFT 103. As seen from the direction normal to the substrate 11, the TFT 103 (the metal oxide layer 16A) and the transparent connecting electrode 26a may be arranged inside the opening 26p.

Thus, in the present embodiment, since the first transparent electrode 24, which is the pixel electrode PE, and the transparent connecting electrode 26a are arranged so as not to overlap the channel region 16c of the TFT 103, it is possible to suppress the variation of the TFT characteristics (the threshold voltage Vth) due to the voltage of the pixel electrode PE. Moreover, as in the previous embodiment, the pixel pitch can be shortened. Furthermore, it is possible to increase the pixel aperture ratio as compared with a case in which the drain electrode is formed by using a metal film. Note however that in the present embodiment, since the pixel contact hole is deeper than the first embodiment, the liquid crystal alignment may be disturbed, in which case the pixel contact portion may be shaded.

In the present embodiment, as the first insulating layer 22 and the second insulating layer 28 are etched at the same time, it is possible to reduce the number of photomasks used in the manufacturing process (the number of photo steps) as compared with that of the first embodiment.

Figure 16:
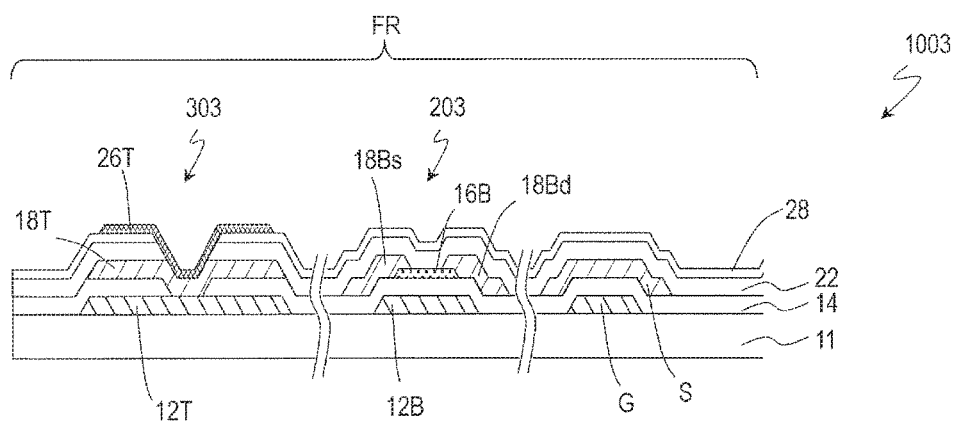
FIGS. 16(a) and 16(b) are cross-sectional views showing a portion of a cross-sectional structure of a frame region FR and a display region DR, respectively, of the semiconductor device 1003.
Figure 16:
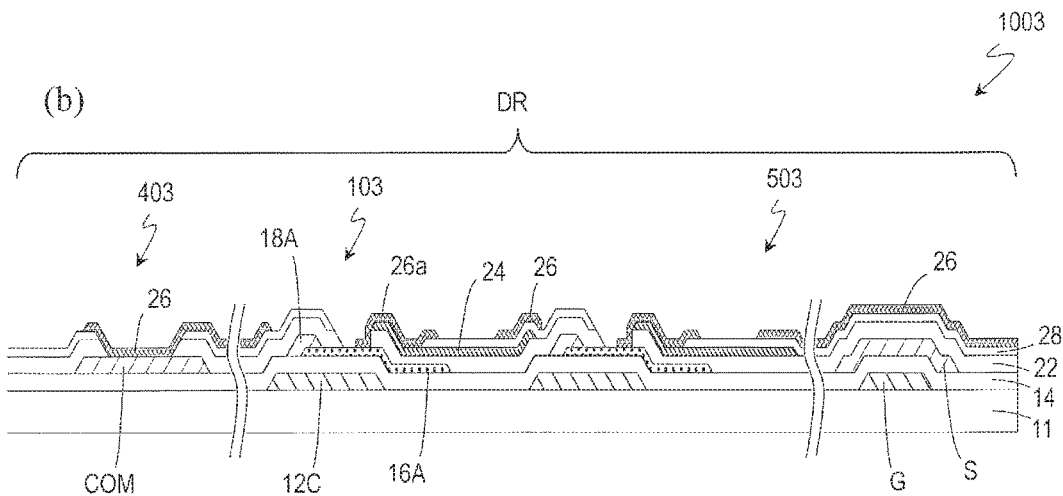

Referring to FIG. 16, cross-sectional structures of the frame region FR and the display region DR of the semiconductor device 1003 will be described in greater detail. The semiconductor device 1003 is suitably applied to FFS-mode display devices.

FIG. 16(a) a cross-sectional view illustrating a circuit TFT 203, a terminal portion 303 and an intersection between a source line and a gate line in the frame region FR. FIG. 16(b) is a cross-sectional view illustrating a common contact portion 403 in the frame region FR, and a pixel TFT 103, a storage capacitor 503 and an intersection between a source line and a gate line in the display region DR.

The pixel TFT 103 has a structure described above with reference to FIG. 15. The circuit TFT 203 and the terminal portion 303 have similar structures to those of the circuit TFT 202 and the terminal portion 302 described above with reference to FIG. 12.

The common contact portion 403 includes the second transparent electrode 26, which is the common electrode CE, and the common line COM. The second transparent electrode 26 is in contact with the common line COM in the opening formed in the first insulating layer 22 and the second insulating layer 28.

In the display region DR, a portion of the second transparent electrode 26 may overlap the first transparent electrode 24 with the second insulating layer 28 therebetween, thereby forming the storage capacitor 503.

Next, an example of a method for manufacturing the semiconductor device 1003 will be described.

Figure 17:
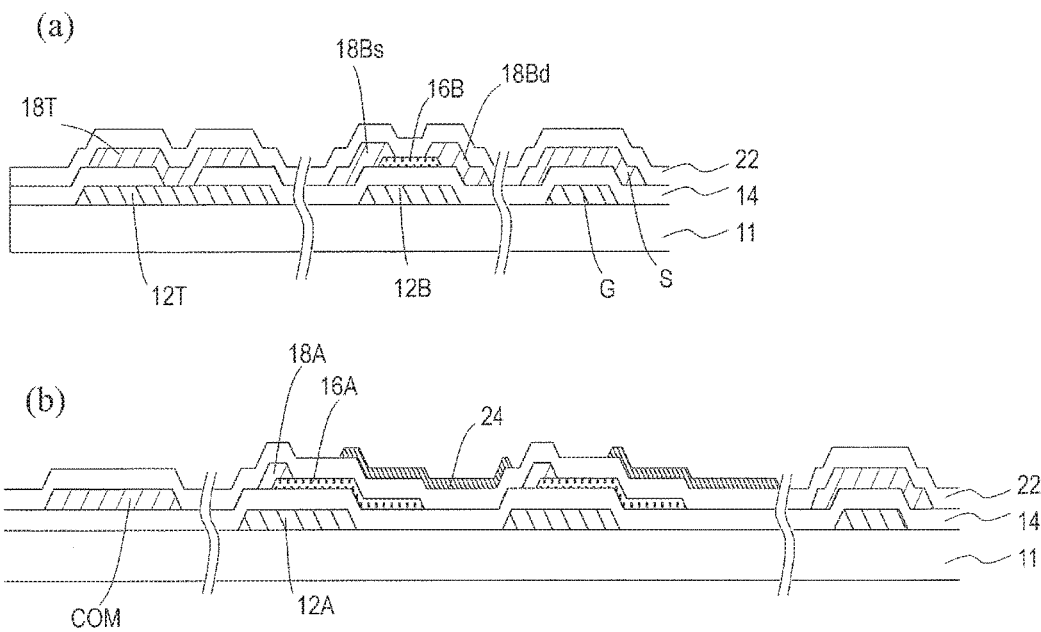
FIGS. 17(a) and 17(b) are schematic process step cross-sectional views illustrating a method for manufacturing the semiconductor device 1003, wherein (a) shows a portion of the frame region FR and (b) shows a portion of the display region DR.
Figure 18:
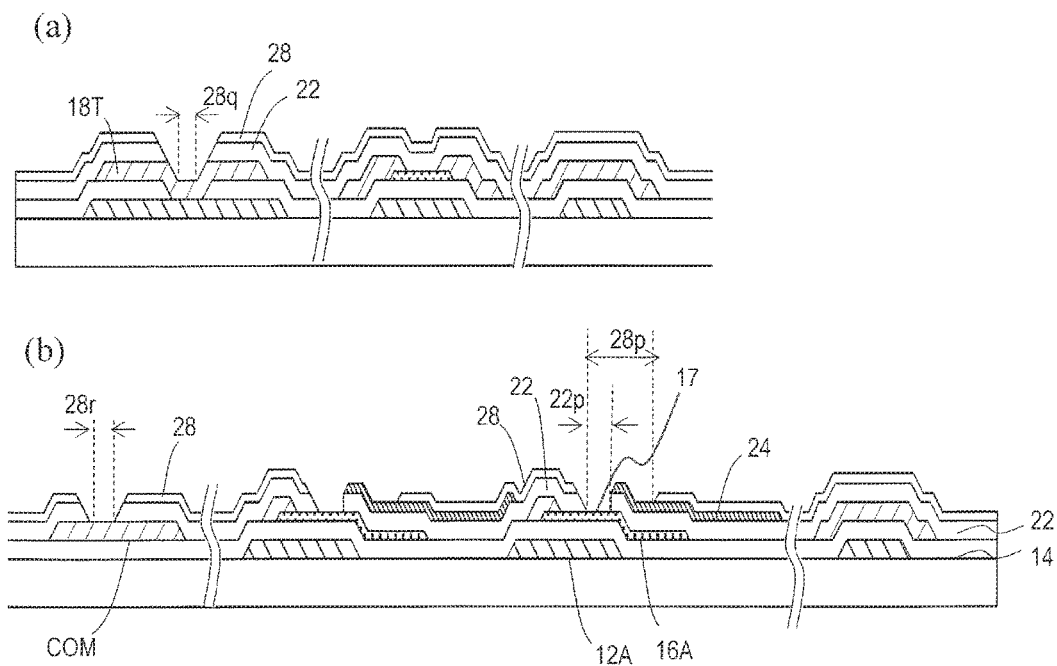
FIGS. 18(a) and 18(b) are schematic process step cross-sectional views illustrating the method for manufacturing the semiconductor device 1003, wherein (a) shows a portion of the frame region FR and (b) shows a portion of the display region DR.

FIG. 17 and FIG. 18 are schematic process step cross-sectional views illustrating the method for manufacturing the semiconductor device 1003. In each figure, (a) shows a portion of the frame region FR of the semiconductor device 1003, and (b) shows a portion of the display region DR of the semiconductor device 1003. The material, the thickness, the method of formation, etc., of each layer will not be described below if they are similar to those of the previous embodiment (FIG. 5 to FIG. 10).

As shown in FIGS. 17(a) and 17(b), a gate line layer, the gate insulating layer 14 covering the gate line layer, the metal oxide layer 16A, the metal oxide layer 16B, a source line layer, and the first insulating layer 22 covering the source line layer are formed on the substrate 11. The gate line layer includes the gate electrode 12A of the pixel TFT, the gate electrode 12B of the circuit TFT, and the gate line G. The source line layer includes the source electrode 18A, the source and drain electrodes 18Bs and 18Bd of the circuit TFT, the common line COM, and the source connecting portion 18T. Then, the first transparent conductive film is formed on the first insulating layer 22 and is patterned, thereby obtaining the first transparent electrode 24, which becomes the pixel electrode PE.

Next, as shown in FIGS. 18(a) and 18(b), the second insulating layer 28 is formed so as to cover the first insulating layer 22 and the first transparent electrode 24. Then, a resist mask (not shown) is provided on the second insulating layer 28, and the first insulating layer 22 and the second insulating layer 28 are etched. During the etching, the source conductive film, the oxide semiconductor film and the first transparent conductive film function as an etch stop. Through this etching, there are formed the opening 28q through which a portion of the source connecting portion 18T is exposed, and the opening 28r through which a portion of the common line COM is exposed. A portion of the second insulating layer 28 that is not covered by the resist mask is removed, thereby forming the opening 28p. Moreover, a portion of the first insulating layer 22 that is not covered by the resist mask or by the first transparent electrode 24 is removed, thereby forming the opening 22p through which a portion of the metal oxide layer 16A is exposed. The pixel contact hole formed by these openings 22p and 28p exposes the region 17 including a portion of the metal oxide layer 16A that is to be the drain contact region, and a portion of the first transparent electrode 24.

Then, the second transparent conductive film is formed on the second insulating layer 28 and in the openings 28q, 28r, 28p and 22p and is patterned, thereby obtaining the second transparent connecting portion 26T, the second transparent electrode 26, which functions as the common electrode CE, and the transparent connecting electrode 26a (see FIGS. 16(a) and 16(b)). A phosphate-based etchant may be used for the patterning, as in the previous embodiment.

The second transparent connecting portion 26T is arranged so as to be in contact with a portion of the source connecting portion 18T in the opening 28q formed in the first insulating layer 22 and the second insulating layer 28. The second transparent electrode 26 is arranged so as to be in contact with a portion of the common line COM in the opening 28r. At least a portion of the second transparent electrode 26 is arranged so as to overlap the first transparent electrode 24 with the second insulating layer 28 therebetween, thereby forming the storage capacitor 503. In the pixel contact hole, the transparent connecting electrode 26a is arranged so as to be in contact with a portion of the exposed region 17 of the metal oxide layer 16A in the opening 22p and in contact with an exposed portion of the first transparent electrode 24. Thus, the semiconductor device 1003 is manufactured.

Fourth Embodiment

A structure of a semiconductor device of a fourth embodiment of the present invention will now be described with reference to the drawings.

The semiconductor device of the present embodiment includes an etch-stop-type TFT 104 as the pixel TFT. The present embodiment is different from the semiconductor device 1001 of the first embodiment in that a protection layer (etch stop layer) is provided between the metal oxide layer 16A and the source line layer so as to cover at least the channel region 16c of the metal oxide layer 16A.

Figure 19:
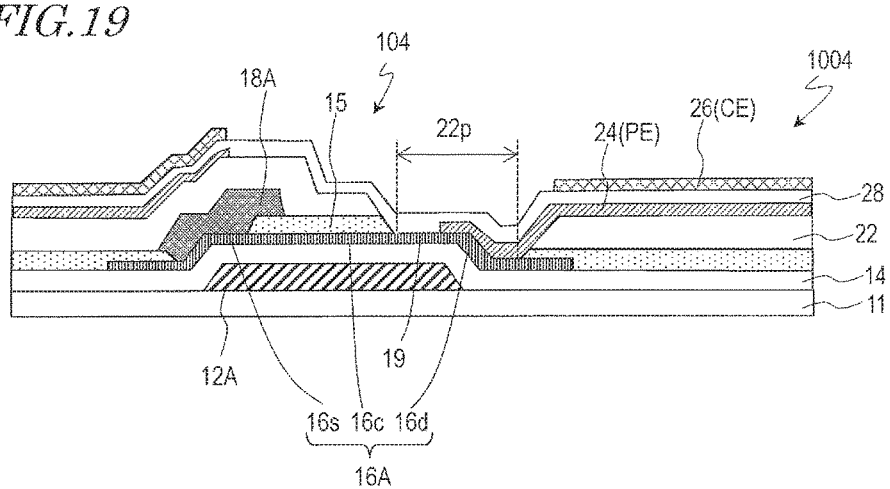
FIG. 19 is a cross-sectional view schematically showing a portion of a semiconductor device (TFT substrate) 1004 of a fourth embodiment.

FIG. 19 is a cross-sectional view schematically showing a portion of a semiconductor device (TFT substrate) 1004 of the present embodiment. In FIG. 19, like elements to those of FIG. 1 are denoted by like reference signs and will not be described below.

Each pixel region Pix of the semiconductor device 1004 includes the TFT 104 supported on the substrate 11, the first insulating layer 22 covering the TFT 104, the first transparent electrode 24, the second transparent electrode 26, and the second insulating layer 28 arranged between the first and second transparent electrodes 24 and 26. In the present embodiment, the first transparent electrode 24 is electrically connected the TFT 104, and functions as a pixel electrode PE. The second transparent electrode 26 functions as a common electrode CE, for example.

The metal oxide layer 16A of the TFT 104 is covered by an etch stop layer 15. The etch stop layer 15 may be formed so as to be in contact with at least a portion of the channel region 16c of the metal oxide layer 16A.

A source opening through which the source contact region 16s of the metal oxide layer 16A is exposed is formed in the etch stop layer 15. The source electrode 18A is provided on the etch stop layer 15, and is in contact with the source contact region 16s in the source opening formed in the etch stop layer 15.

An opening (pixel contact hole) 22p through which a region of the metal oxide layer 16A including the drain contact region 16d is exposed is formed in the etch stop layer 15 and the first insulating layer 22. The pixel contact hole may be formed by etching the etch stop layer 15 and the first insulating layer 22 in one process. In this case, the side wall of the etch stop layer 15 and the side wall of the first insulating layer 22 are aligned together at a portion of the side wall of the pixel contact hole. Note that the etch stop layer 15 and the first insulating layer 22 may not be etched in one process. In this case, at least a portion of the opening of the first insulating layer 22 is arranged so as to overlap the drain opening of the etch stop layer 15, thereby forming the pixel contact hole.

The first transparent electrode 24, which is the pixel electrode PE, is formed on the first insulating layer 22 and in the opening 22p. The first transparent electrode 24 is in contact with the drain contact region 16d, which is a region (exposed region) of the metal oxide layer 16A that is exposed through the opening 22p.

In the present embodiment, as seen from the direction normal to the substrate 11, the channel region 16c-side end portion of the first transparent electrode 24 extends so as to cross the exposed region of the metal oxide layer 16A (i.e., the bottom surface of the pixel contact hole). Therefore, as seen from the direction normal to the substrate 11, the first transparent electrode 24 does not overlap the channel region 16c of the metal oxide layer 16A.

A portion 19 of the exposed region of the metal oxide layer 16A that is located on the source side of the drain contact region 16d may be in contact with the second insulating layer 28. As in the first embodiment (FIG. 1), if the second insulating layer 28 has a property of reducing the oxide semiconductor included in the metal oxide layer 16A, the resistance of the portion 19 is lowered, thereby becoming a low resistance region having a lower electric resistance than the channel region 16c. When the second insulating layer 28 is not a reducing insulative layer, the portion 19 remains as a semiconductor region and becomes a portion of the channel region.

Thus, in the present embodiment, since the first transparent electrode 24, which is the pixel electrode PE, is arranged so as not to overlap the channel region 16c of the TFT 104, it is possible to suppress the variation of the TFT characteristics (the threshold voltage Vth) due to the voltage of the pixel electrode PE. Moreover, as in the previous embodiment, the pixel pitch can be shortened. Furthermore, it is possible to increase the pixel aperture ratio as compared with a case in which the drain electrode is formed by using a metal film.

Next, an example of a method for manufacturing the semiconductor device 1004 will be described.

Figure 20:
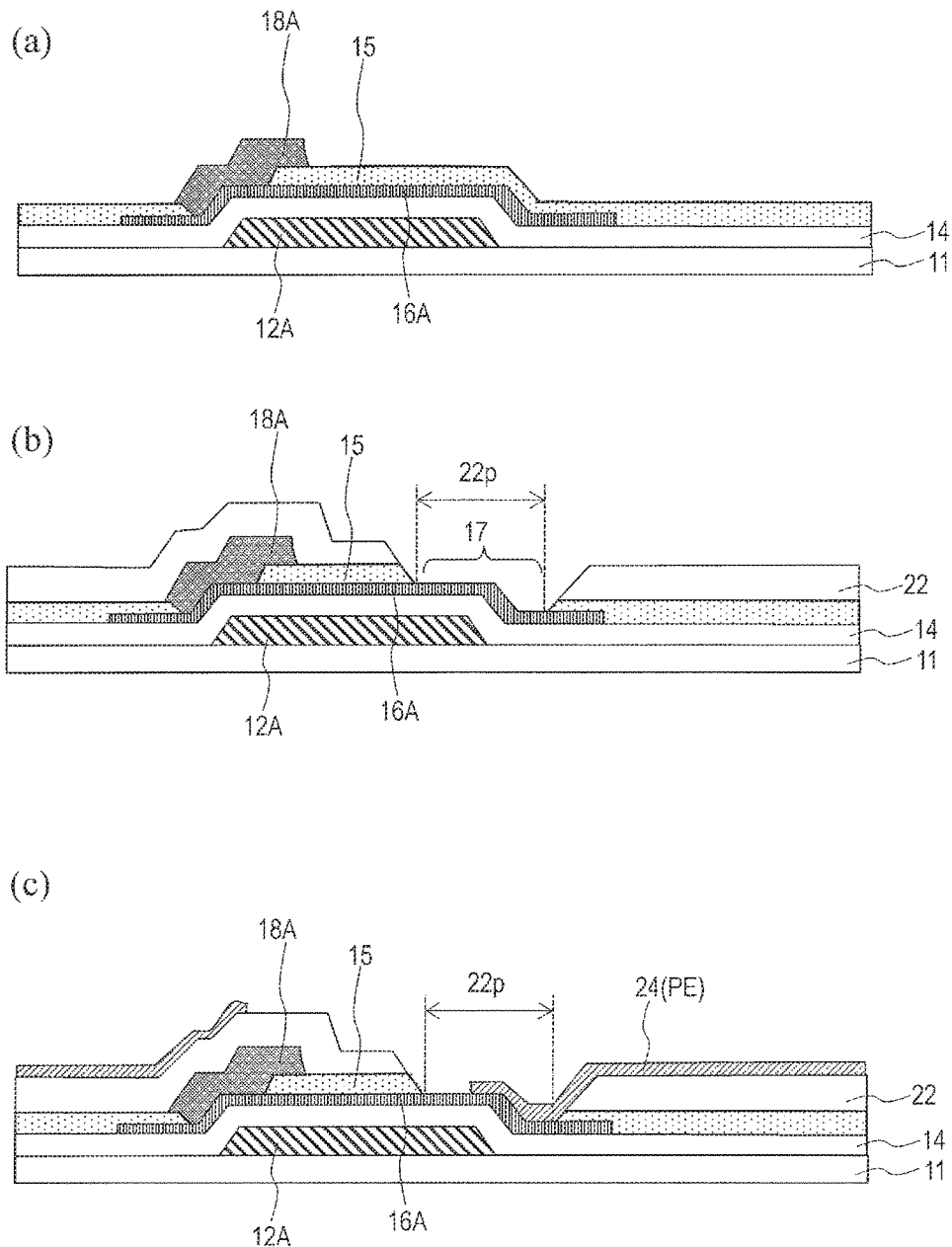
FIGS. 20(a) to 20(c) are schematic process step cross-sectional views each illustrating a method for manufacturing a semiconductor device 1004.

FIGS. 20(a) to 20(c) are schematic process step cross-sectional views illustrating the method for manufacturing the semiconductor device 1004. The material, the thickness, the method of formation, etc., of each layer will not be described below if they are similar to those of the previous embodiment (FIG. 5 to FIG. 10).

As shown in FIG. 20(a), a gate line layer, the gate insulating layer 14 covering the gate line layer, and the metal oxide layer 16A are formed on the substrate 11. Next, the etch stop layer 15 is formed so as to cover the metal oxide layer 16A, and a source opening through which a portion of the metal oxide layer 16A to be the source contact region is exposed is provided in the etch stop layer 15. An oxide film (thickness: 30 to 300 nm) such as an SiOx film (including an $SiO_2$ film), for example, is preferably used as the etch stop layer 15.

Then, a source conductive film is formed on the etch stop layer 15 and is patterned, thereby forming the source line layer including the source electrode 18A. The source electrode 18A is arranged so as to be in contact with the metal oxide layer 16A in the source opening of the etch stop layer 15. Thus, in the present embodiment, it is possible to perform the etch step for forming the source line layer while the channel region 16c of the metal oxide layer 16A is protected by the etch stop layer 15.

Then, as shown in FIG. 20(b), the first insulating layer 22 is formed on the source line layer and the etch stop layer 15. Then, the first insulating layer 22 and the etch stop layer 15 are etched in one process, thereby forming the opening (pixel contact hole) 22p through which the region 17 including a portion of the metal oxide layer 16A to be the drain contact region is exposed.

Next, as shown in FIG. 20(c), the first transparent conductive film is formed on the first insulating layer 22 and in the opening 22p and is patterned, thereby obtaining the first transparent electrode 24 to be the pixel electrode PE. The first transparent electrode 24 is in contact with a portion of the exposed region 17 of the metal oxide layer 16A in the opening 22p.

Then, the second insulating layer 28 and the second transparent electrode 26 are formed by a method similar to the first embodiment (FIG. 10), thereby obtaining the semiconductor device 1004.

Note that the configuration and the manufacturing method of the semiconductor device of the present embodiment are not limited to those shown in the figures. For example, in the semiconductor devices 1001 to 1003 of the previous embodiments, an etch stop layer may be provided between the metal oxide layer 16A and the source electrode 18A so as to cover at least a portion of the channel region.

Fifth Embodiment

A fifth embodiment of a semiconductor device of the present invention will now be described with reference to the drawings. The semiconductor device of the present embodiment is an active matrix substrate including oxide semiconductor TFTs and crystalline silicon TFTs formed on the same substrate.

The active matrix substrate includes a TFT (pixel TFT) for each pixel. The pixel TFT is an oxide semiconductor TFT using an In—Sn—Zn—O-based semiconductor film, for example, as the active layer.

A part or whole of peripheral driver circuits is in some cases formed integral on the same substrate as the pixel TFTs. Such an active matrix substrate is called a driver-monolithic active matrix substrate. In a driver-monolithic active matrix substrate, peripheral driver circuits are provided in a region (the non-display region or the bezel region) other than the region (the display region) that includes a plurality of pixels. Crystalline silicon TFTs using a polycrystalline silicon film as the active layer are used as TFTs (circuit TFTs) of the peripheral driver circuits, for example. By using oxide semiconductor TFTs as pixel TFTs and using crystalline silicon TFTs as circuit TFTs, it is possible to reduce the power consumption in the display region while also reducing the size of the bezel region.

Any of TFTs 101 to 104 described above with reference to FIG. 1A, FIG. 11, FIG. 15 and FIG. 19 can be used as the pixel TFT. This will be discussed later.

Next, a more detailed configuration of the active matrix substrate of the present embodiment will be described with reference to the drawings.

Figure 21:
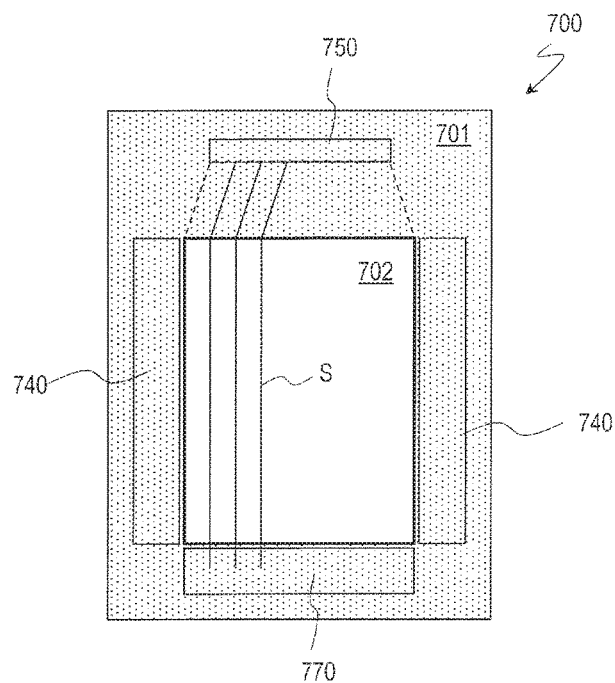
FIG. 21 is a schematic plan view showing an example of a planar structure of an active matrix substrate 700 of a fifth embodiment.
Figure 22:
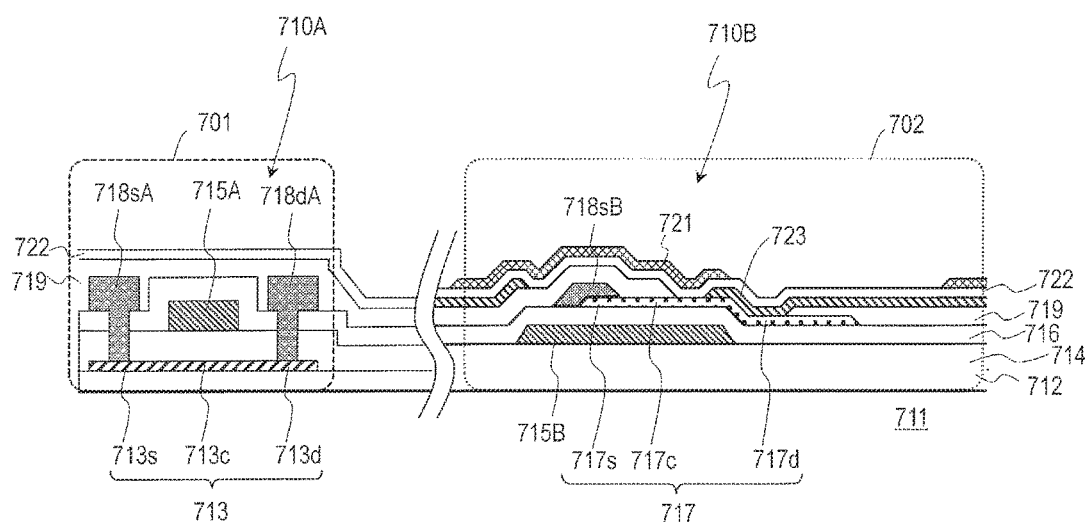
FIG. 22 is a cross-sectional view showing a crystalline silicon TFT 710A and an oxide semiconductor TFT 710B of the active matrix substrate 700.

FIG. 21 is a schematic plan view showing an example of a planar structure of the active matrix substrate 700 of the present embodiment, and FIG. 22 is a cross-sectional view showing a cross-sectional structure of crystalline silicon TFT (hereinafter referred to as a "first thin film transistor") 710A and an oxide semiconductor TFT (hereinafter referred to as a "second thin film transistor") 710B of the active matrix substrate 700.

As shown in FIG. 21, the active matrix substrate 700 has a display region 702 including a plurality of pixels, and a region (non-display region) other than the display region 702. The non-display region includes a driver circuit formation region 701 where driver circuits are provided. For example, a gate driver circuit 740, a test circuit 770, etc., are provided in the driver circuit formation region 701. A plurality of gate bus lines (not shown) extending in the row direction and a plurality of source bus lines S extending in the column direction are formed in the display region 702. Although not shown in the figures, each pixel is defined by a gate bus line and a source bus line S, for example. The gate bus lines are connected respectively to terminals of the gate driver circuit. The source bus lines S are connected respectively to terminals of a driver IC 750 mounted on the active matrix substrate 700.

As shown in FIG. 22, on the active matrix substrate 700, a second thin film transistor 710B is formed as a pixel TFT in each pixel of the display region 702, and a first thin film transistor 710A is formed as a circuit TFT in the driver circuit formation region 701.

The active matrix substrate 700 includes a substrate 711, a base film 712 formed on the surface of the substrate 711, the first thin film transistor 710A formed on the base film 712, and the second thin film transistor 710B formed on the base film 712. The first thin film transistor 710A is a crystalline silicon TFT having an active region that primarily includes crystalline silicon. The second thin film transistor 710B is an oxide semiconductor TFT having an active region that primarily includes an oxide semiconductor. The first thin film transistor 710A and the second thin film transistor 710B are built integral with the substrate 711. An "active region" as used herein refers to a region, where the channel is formed, of a semiconductor layer to be the active layer of the TFT.

The first thin film transistor 710A includes a crystalline silicon semiconductor layer (e.g., a low-temperature poly-silicon layer) 713 formed on the base film 712, a first insulating layer 714 covering the crystalline silicon semiconductor layer 713, and a gate electrode 715A provided on the first insulating layer 714. A portion of the first insulating layer 714 that is located between the crystalline silicon semiconductor layer 713 and the gate electrode 715A functions as the gate insulating film of the first thin film transistor 710A. The crystalline silicon semiconductor layer 713 includes a region (active region) 713c where the channel is formed, and a source region 713s and a drain region 713d that are located on opposite sides of the active region. In this example, a portion of the crystalline silicon semiconductor layer 713 that overlaps the gate electrode 715A with the first insulating layer 714 therebetween becomes the active region 713c. The first thin film transistor 710A also includes a source electrode 718sA and a drain electrode 718dA that are connected to the source region 713s and the drain region 713d, respectively. The source and drain electrodes 718sA and 718dA may be formed on an interlayer insulating film (herein, a second insulating layer 716) that covers the gate electrode 715A and the crystalline silicon semiconductor layer 713, and may be connected to the crystalline silicon semiconductor layer 713 in the contact holes formed in the interlayer insulating film.

The second thin film transistor 710B includes a gate electrode 715B provided on the base film 712, the second insulating layer 716 covering the gate electrode 715B, and an oxide semiconductor layer 717 arranged on the second insulating layer 716. As shown in the figure, the first insulating layer 714, which is the gate insulating film of the first thin film transistor 710A, may be provided to extend to a region where the second thin film transistor 710B is to be formed. In such a case, the oxide semiconductor layer 717 may be formed on the first insulating layer 714. A portion of the second insulating layer 716 that is located between the gate electrode 715B and the oxide semiconductor layer 717 functions as the gate insulating film of the second thin film transistor 710B. The oxide semiconductor layer 717 includes a region (active region) 717c where the channel is formed, and a source contact region 717s and a drain contact region 717d located on opposite sides of the active region. In this example, a portion of the oxide semiconductor layer 717 that overlaps the gate electrode 715B with the second insulating layer 716 therebetween becomes the active region 717c. The second thin film transistor 710B further includes a source electrode 718sB connected to the source contact region 717s. Note that alternatively, the base film 712 may be absent on the substrate 711.

The thin film transistors 710A and 710B are covered by a passivation film 719. In the second thin film transistor 710B, which functions as the pixel TFT, the gate electrode 715B is connected to a gate bus line (not shown) and the source electrode 718sB to a source bus line (not shown). A pixel electrode 723 is provided on the passivation film 719, and is in contact with the drain contact region 717d in the opening of the passivation film 719. A video signal is supplied to the source electrode 718sB via the source bus line, and an electric charge is written as necessary to the pixel electrode 723 based on the gate signal from the gate bus line.

Note that as shown in the figure, a transparent conductive layer (common electrode) 721 may be arranged, as a common electrode, on the passivation film 719 and the pixel electrode 723, and a third insulating layer 722 may be formed between the common electrode 721 and the pixel electrode 723. In this case, a slit-shaped opening may be provided in the common electrode 721. Such an active matrix substrate 700 is applicable to display devices of an FFS (Fringe Field Switching) mode, for example. The FFS mode is of a transverse electric field scheme in which a pair of electrodes are provided on one substrate, and an electric field is applied to liquid crystal molecules in a direction parallel to the substrate surface (the transverse direction). In this example, there is produced an electric field represented by lines of electric force that emerge from the common electrode 721, pass through the liquid crystal layer (not shown), and further extend to the pixel electrode 723 through the slit-shaped opening of the common electrode 721. This electric field has a component that is transverse with respect to the liquid crystal layer. As a result, it is possible to apply a transverse electric field through the liquid crystal layer. The transverse electric field scheme is advantageous in that liquid crystal molecules do not rise from the substrate, thereby realizing a wider viewing angle than the vertical electric field scheme.

Any of the TFTs 101 to 104 described with reference to FIG. 1A, FIG. 11, FIG. 15 and FIG. 19 in the first to fourth embodiments may be used as the second thin film transistor 710B of the present embodiment. When the TFTs 101 to 104 are used, the gate electrode 12A, the gate insulating layer 14, the oxide semiconductor layer 16A and the source electrode 18A of the TFTs 101 to 104 may correspond respectively to the gate electrode 715B, the second insulating layer (gate insulating layer) 716, the oxide semiconductor layer 717 and the source electrode 718sB shown in FIG. 22.

The thin film transistor 710B, which is an oxide semiconductor TFT, may be used as TFTs of the test circuit 770 (test TFTs) shown in FIG. 21.

Note that although not shown in the figure, the test TFTs and the test circuit may be formed in the region where the driver IC 750 shown in FIG. 21 is mounted, for example. In this case, the test TFTs are arranged between the driver IC 750 and the substrate 711.

In the illustrated example, the first thin film transistor 710A has a top gate structure in which the crystalline silicon semiconductor layer 713 is arranged between the gate electrode 715A and the substrate 711 (the base film 712). On the other hand, the second thin film transistor 710B has a bottom gate structure in which the gate electrode 715B is arranged between the oxide semiconductor layer 717 and the substrate 711 (the base film 712). By employing such a structure, it is possible to more effectively suppress the increase in the number of manufacturing steps and the increase in the manufacturing cost when integrally forming two different thin film transistors 710A and 710B on the same substrate 711.

The TFT structures of the first thin film transistor 710A and the second thin film transistor 710B are not limited to those described above. For example, these thin film transistors 710A and 710B may have the same TFT structure. Alternatively, the first thin film transistor 710A may have a bottom gate structure while the second thin film transistor 710B has a top gate structure. For the bottom gate structure, it may be of the channel-etch type, as with the thin film transistor 710B, or it may be of the etch-stop type.

The second insulating layer 716, which is the gate insulating film of the second thin film transistor 710B, may be provided so as to extend to a region where the first thin film transistor 710A is formed, and may function as an interlayer insulating film that covers the gate electrode 715A and the crystalline silicon semiconductor layer 713 of the first thin film transistor 710A. When the interlayer insulating film of the first thin film transistor 710A and the gate insulating film of the second thin film transistor 710B are formed in the same layer (second insulating layer) 716, as described above, the second insulating layer 716 may have a layered structure. For example, the second insulating layer 716 may have a layered structure including a hydrogen-donating layer (e.g., a silicon nitride layer) that is capable of supplying hydrogen, and an oxygen-donating layer (e.g., a silicon oxide layer) capable of supplying oxygen, which is arranged on the hydrogen-donating layer.

The gate electrode 715A of the first thin film transistor 710A and the gate electrode 715B of the second thin film transistor 710B may be formed in the same layer. The source and drain electrodes 718*s*A and 718*d*A of the first thin film transistor 710A and the source electrode 718*s*B of the second thin film transistor 710B may be formed in the same layer. To be "formed in the same layer" means that they are formed by using the same film (conductive film). Then, it is possible to suppress the increase in the number of manufacturing steps and the increase in the manufacturing cost.

INDUSTRIAL APPLICABILITY

The embodiments of the present invention are widely applicable to various semiconductor devices including oxide semiconductor TFTs. For example, they are applied to circuit substrates such as active matrix substrates, display devices such as liquid crystal display devices, organic electroluminescence (EL) display devices, inorganic electroluminescence display devices and MEMS display devices, imaging devices such as image sensor devices, image input devices, fingerprint reader devices, and various electronic devices such as semiconductor memory devices. Particularly, they are suitably applied to high-definition liquid crystal display devices.

REFERENCE SIGNS LIST

11: Substrate
12A, 12B: Gate electrode
12T: Gate connecting portion
14: Gate insulating layer
14*q*: Opening
16A, 16B: Metal oxide layer
16*c*: Channel region
16*d*: Drain contact region
16*s*: Source contact region
17: Region exposed through pixel contact hole
18A: Source electrode
18B*d*: Drain electrode
18B*s*: Source electrode
22: First insulating layer
22*p*, 22*q*, 22*r*: Opening
24: First transparent electrode
26: Second transparent electrode
26C: Common contact connecting portion
26T: Second transparent connecting portion
26*a*: Transparent connecting electrode
28: Second insulating layer
28*p*, 28*q*, 28*r*, 28*u*: Opening
101, 102, 103, 104: TFT
301, 302, 303: Terminal portion
401, 402, 403: Common contact portion
501, 502, 503: Storage capacitor
1001, 1002, 1003, 1004: Semiconductor device
CE: Common electrode
PE: Pixel electrode
S: Source line
G: Gate line
COM: Common line
DR: Display region
FR: Frame region
Pix: Pixel region

The invention claimed is:

1. A semiconductor device comprising a substrate and a thin film transistor supported on the substrate, wherein:
   the thin film transistor includes:
      a gate electrode;
      a gate insulating layer covering the gate electrode;
      a metal oxide layer arranged on the gate insulating layer, the metal oxide layer including a channel region, and a source contact region and a drain contact region that are arranged on opposite sides of the channel region;
      a first electrode arranged so as to be in contact with the source contact region of the metal oxide layer;
      a first insulating layer on the metal oxide layer and the first electrode, the first insulating layer including a first opening therein through which a portion of the metal oxide layer is exposed; and
      a light-transmissive second electrode on the first insulating layer and in a contact hole including the first opening; wherein:
   in the contact hole, the second electrode is in contact with only a portion of a region of the metal oxide layer that is exposed through the contact hole,
   the region of the metal oxide layer that is exposed through the contact hole includes a) the drain contact region that is in contact with the second electrode and b) a non-contact region that is not in contact with the second electrode, the non-contact region being a portion of the channel region, and
   as seen from a direction normal to the substrate, the second electrode does not overlap the channel region of the metal oxide layer.

2. The semiconductor device according to claim 1, wherein as seen from the direction normal to the substrate, a channel region-side edge of the second electrode extends across the region of the metal oxide layer that is exposed through the contact hole.

3. The semiconductor device according to claim 1, further comprises:

a second insulating layer on the first insulating layer and the second electrode, and a light-transmissive third electrode on the second insulating layer, wherein:

of the region of the metal oxide layer that is exposed through the contact hole, the non-contact region that is not in contact with the second electrode is in contact with the second insulating layer.

4. The semiconductor device according to claim 3, wherein the second insulating layer has a capability of reducing the metal oxide layer, and a portion of the metal oxide layer that is in contact with the second insulating layer is a low resistance region having a lower electric resistance than the channel region.

5. The semiconductor device according to claim 1, further comprising:

between the first insulating layer and the second electrode, a light-transmissive third electrode on the first insulating layer, and a second insulating layer covering the third electrode, wherein:

the second insulating layer includes a second opening, and at least a portion of the second opening overlaps the first opening as seen from the direction normal to the substrate;

the contact hole includes the first opening and the second opening; and the second electrode is on the second insulating layer and in the contact hole.

6. The semiconductor device according to claim 5, wherein at a side wall of the contact hole, a side surface of the second opening and a side surface of the first opening are aligned together.

7. The semiconductor device according to claim 5, wherein:

a portion of the third electrode is exposed through the second opening; and the second electrode is in contact with the drain contact region of the metal oxide layer and a portion of the third electrode in the contact hole, whereby the third electrode is connected to the drain contact region with the second electrode therebetween.

8. The semiconductor device according to claim 7, wherein the third electrode is a pixel electrode.

9. The semiconductor device according to claim 1, wherein the second electrode is a pixel electrode.

10. The semiconductor device according to claim 1, wherein the thin film transistor has a channel-etch structure.

11. The semiconductor device according to claim 1, further comprising a protective layer arranged between the metal oxide layer and the first electrode, the protective layer covering at least the channel region.

12. The semiconductor device according to claim 1, wherein the metal oxide layer includes tin, and the second electrode does not include tin.

13. The semiconductor device according to claim 1, wherein the metal oxide layer includes an In—Sn—Zn—O-based oxide.

14. The semiconductor device according to claim 1, wherein the second electrode includes an indium-zinc oxide.

15. The semiconductor device according to claim 1, wherein the first insulating layer does not include an organic insulating layer.

16. A method for manufacturing a semiconductor device, comprising the steps of:

(A) forming a gate electrode and a gate line on a substrate;
(B) forming a gate insulating layer covering the gate electrode and the gate line;
(C) forming an oxide semiconductor film on the gate insulating layer and patterning the oxide semiconductor film, thereby obtaining a metal oxide layer;
(D) forming a first electrode in contact with a portion of an upper surface of the metal oxide layer;
(E) forming an insulating layer covering the metal oxide layer and the first electrode;
(F) forming a contact hole in the insulating layer, through which a portion of an upper surface of the metal oxide layer is exposed;
(G) forming a light-transmissive second electrode on the insulating layer and in the contact hole, wherein the second electrode is in contact, in the contact hole, with a portion of a region of the metal oxide layer that is exposed through the contact hole;
(H) forming another insulating layer that covers the insulating layer and the second electrode and is in contact, in the contact hole, with another portion of the region of the metal oxide layer that is exposed through the contact hole; and
(I) forming a third electrode on the other insulating layer.

17. The method for manufacturing a semiconductor device according to claim 16, wherein:

the second electrode does not include tin, and the metal oxide layer includes tin; and the step (G) includes a step of etching the second electrode without removing the metal oxide layer by using a phosphate-based etching solution.

18. The method for manufacturing a semiconductor device according to claim 16, wherein the other insulating layer has a capability of reducing the metal oxide layer, and a portion of the metal oxide layer that is in contact with the other insulating layer is a low resistance region having a lower electric resistance than a portion of the metal oxide layer that is in contact with the insulating layer.

19. A method for manufacturing a semiconductor device including a thin film transistor, comprising the steps of:

(a) forming a gate electrode and a gate line on a substrate;
(b) forming a gate insulating layer covering the gate electrode and the gate line;
(c) forming an oxide semiconductor film on the gate insulating layer and patterning the oxide semiconductor film, thereby obtaining a metal oxide layer;
(d) forming a first electrode in contact with a portion of an upper surface of the metal oxide layer;
(e) forming a first insulating layer covering the metal oxide layer and the first electrode;
(f) forming another light-transmissive electrode on the first insulating layer;
(g) forming a second insulating layer so as to cover the first insulating layer and the other electrode;
(h) etching the first insulating layer and the second insulating layer, thereby forming a contact hole through which a portion of an upper surface of the metal oxide layer is exposed; and
(i) forming a light-transmissive second electrode on the first insulating layer and in the contact hole, wherein the second electrode is in contact, in the contact hole, with only a first portion of a region of the metal oxide layer that is exposed through the contact hole, the region of the metal oxide layer that is exposed through the contact hole further including a second portion that is not in contact with the second electrode, the second portion being a portion of a channel region of the thin film transistor.

20. The method for manufacturing a semiconductor device according to claim 19, wherein:

in the step (h), the contact hole exposes a portion of an upper surface of the metal oxide layer and a portion of the other electrode; and in the step (i), the second electrode is in contact, in the contact hole, with the first portion of a region of the metal oxide layer that is exposed through the contact hole and with the other electrode.

* * * * *